US009615069B2

(12) United States Patent
Okamoto et al.

(10) Patent No.: US 9,615,069 B2
(45) Date of Patent: Apr. 4, 2017

(54) LIGHT SOURCE UNIT AND PROJECTOR

(71) Applicant: USHIO DENKI KABUSHIKI KAISHA, Tokyo (JP)

(72) Inventors: Masashi Okamoto, Hyogo (JP); Takanori Samejima, Hyogo (JP); Yuichi Miura, Hyogo (JP); Shohei Tsukamoto, Hyogo (JP); Hirotaka Yamada, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 18 days.

(21) Appl. No.: 14/846,552

(22) Filed: Sep. 4, 2015

(65) Prior Publication Data
US 2015/0380898 A1    Dec. 31, 2015

Related U.S. Application Data

(63) Continuation of application No. PCT/JP2014/055794, filed on Mar. 6, 2014.

(30) Foreign Application Priority Data

Mar. 6, 2013  (JP) ................................. 2013-043656
Apr. 25, 2013 (JP) ................................. 2013-092601
Jan. 24, 2014 (JP) ................................. 2014-011249

(51) Int. Cl.
*H04N 9/31*     (2006.01)
*H05B 33/08*    (2006.01)
(Continued)

(52) U.S. Cl.
CPC ......... *H04N 9/3155* (2013.01); *G03B 21/208* (2013.01); *G03B 21/2033* (2013.01);
(Continued)

(58) Field of Classification Search
CPC .. H04N 9/3155; H04N 9/3182; H04N 9/3194; G03B 21/2033; G03B 21/2053; G03B 21/208; G03B 33/06; H01S 5/0683
See application file for complete search history.

(56) References Cited

U.S. PATENT DOCUMENTS 6,953,251 B2 * 10/2005 Seki ....................... G03B 21/26
                                                353/85
7,052,138 B2 *  5/2006 Matsui ................. G09G 3/3413
                                                348/744
(Continued)

FOREIGN PATENT DOCUMENTS

JP    H10-133303 A     5/1998
JP    2001-142141 A    5/2001
(Continued)

OTHER PUBLICATIONS

International Search Report issued in Application No. PCT/JP2014/055794, mailed Jun. 3, 2014.

*Primary Examiner* — Bao-Luan Le
(74) *Attorney, Agent, or Firm* — Michael Best & Friedrich LLP

(57) ABSTRACT

A light source unit includes: a plurality of elemental light sources each including one or more light emitting elements and one or more drive circuits; a control circuit; and a plurality of color band light characteristic measurement sections each configured to receive light to generate color band light characteristic measurement data. A plurality of the light emitting elements in the elemental light sources includes light emitting elements different in wavelength band of emission wavelength from one another. The color band light characteristic measurement sections are provided corresponding to a plurality of the wavelength bands. One or more of the color band light characteristic measurement sections include a first light intensity measurement section
(Continued)

and a second light intensity measurement section. The control circuit generates light intensity indicating values and wavelength deviation indicating values, generates color phase indicating values, and performs first feedback control on the drive circuits.

7 Claims, 7 Drawing Sheets

(51) Int. Cl.
  *G03B 21/20* (2006.01)
  *G03B 33/06* (2006.01)
  *H01S 5/0683* (2006.01)
(52) U.S. Cl.
  CPC ............ *G03B 33/06* (2013.01); *H01S 5/0683* (2013.01); *H04N 9/3182* (2013.01); *H04N 9/3194* (2013.01); *H05B 33/086* (2013.01); *H05B 33/0869* (2013.01); *G03B 21/2053* (2013.01)

(56) References Cited

U.S. PATENT DOCUMENTS

| | | | | |
|---|---|---|---|---|
| 7,059,727 B2* | 6/2006 | Seki | ........................ | G03B 21/26 353/85 |
| 7,088,372 B2* | 8/2006 | Yoshida | ............... | H04N 9/3105 345/10 |
| 7,300,155 B2* | 11/2007 | Miyazawa | ............. | H04N 9/315 348/E9.027 |
| 7,329,009 B2* | 2/2008 | Monch | ................. | H04N 9/3114 348/743 |
| 7,377,654 B2* | 5/2008 | Miyazawa | ............. | H04N 9/315 348/E9.027 |
| 7,377,657 B2* | 5/2008 | Morejon | .............. | G09G 3/3413 348/801 |
| 7,404,645 B2* | 7/2008 | Margulis | ................ | G03B 21/20 348/630 |
| 7,553,033 B2* | 6/2009 | Seki | ........................ | G03B 21/26 353/85 |
| 7,683,912 B2* | 3/2010 | Yoshida | ............... | H04N 9/3105 345/20 |
| 7,717,565 B2* | 5/2010 | Miyazawa | ............. | H04N 9/315 347/255 |
| 7,810,930 B2* | 10/2010 | Miyazawa | ............. | H04N 9/315 348/742 |
| 7,959,303 B2* | 6/2011 | Nishioka | .............. | H04N 9/3155 250/370.15 |
| 8,342,694 B2* | 1/2013 | Shibasaki | ............ | H04N 9/3111 348/687 |
| 8,585,213 B2* | 11/2013 | Plut | ...................... | H04N 9/3155 250/205 |
| 8,684,539 B2* | 4/2014 | Suzuki | ................... | G03B 21/20 315/185 R |
| 8,733,946 B2* | 5/2014 | Sudo | ........................ | G09G 5/10 345/207 |
| 8,777,425 B2* | 7/2014 | Miyazawa | ............. | H04N 9/315 353/98 |
| 8,797,307 B2* | 8/2014 | Grammer | ........... | G02B 27/1033 345/207 |
| 9,285,101 B2* | 3/2016 | Kaneda | .................... | F21V 13/00 |
| 9,478,193 B2* | 10/2016 | Richards | .................. | G09G 5/10 |
| 2004/0061707 A1* | 4/2004 | Yoshida | ............... | H04N 9/3105 345/690 |
| 2004/0263802 A1* | 12/2004 | Seki | ........................ | G03B 21/26 353/99 |
| 2005/0128441 A1* | 6/2005 | Morgan | ............... | G03B 21/2033 353/102 |
| 2005/0231693 A1* | 10/2005 | Seki | ........................ | G03B 21/26 353/99 |
| 2006/0023304 A1* | 2/2006 | Monch | ................. | H04N 9/3114 359/443 |
| 2006/0170883 A1* | 8/2006 | Matsui | ................. | G09G 3/3413 353/85 |
| 2006/0192924 A1* | 8/2006 | Seki | ........................ | G03B 21/26 353/85 |
| 2006/0232502 A1* | 10/2006 | Yoshida | ............... | H04N 9/3105 345/48 |
| 2006/0274286 A1* | 12/2006 | Morejon | .............. | G09G 3/3413 353/85 |
| 2006/0279710 A1* | 12/2006 | Tani | ..................... | H04N 5/7458 353/85 |
| 2007/0035706 A1* | 2/2007 | Margulis | ................ | G03B 21/20 353/122 |
| 2009/0237622 A1* | 9/2009 | Nishioka | .............. | H04N 9/3155 353/85 |
| 2010/0302515 A1* | 12/2010 | Plut | ...................... | H04N 9/3155 353/85 |
| 2010/0315605 A1* | 12/2010 | Arita | .................. | G02B 26/0816 353/98 |
| 2010/0328611 A1* | 12/2010 | Silverstein | ........... | H04N 9/3155 353/7 |
| 2012/0050697 A1* | 3/2012 | Suzuki | ................... | G03B 21/20 353/85 |
| 2013/0016305 A1* | 1/2013 | Kaneda | .................... | F21V 13/00 349/61 |
| 2013/0027372 A1* | 1/2013 | Gammer | ........... | G02B 27/1033 345/207 |
| 2013/0229629 A1* | 9/2013 | Kawamoto | .............. | H04N 9/31 353/30 |

FOREIGN PATENT DOCUMENTS

| | | |
|---|---|---|
| JP | 2004-252112 A | 9/2004 |
| JP | 2006-252777 A | 9/2006 |
| JP | 2007-156211 A | 6/2007 |
| JP | 2008-134378 A | 6/2008 |

* cited by examiner

LIGHT SOURCE UNIT AND PROJECTOR

CROSS REFERENCE TO RELATED APPLICATIONS

This is a continuation of International Application No. PCT/JP2014/055794, filed Mar. 6, 2014, which claims the benefit of Japanese Priority Patent Application JP2013-043656, filed Mar. 6, 2013, Japanese Priority Patent Application JP2013-092601, filed Apr. 25, 2013, and Japanese Priority Patent Application JP2014-011249, filed Jan. 24, 2014, the entire contents of all of which are incorporated herein by reference.

BACKGROUND

The present invention relates to a light source unit that uses light emitting elements such as semiconductor lasers for a plurality of different wavelength bands and is usable in an optical apparatus such as a projector, and to a projector.

For example, in an image display projector such as DLP (trademark) projector and a liquid crystal projector and in a photomask exposure apparatus, a high luminance discharge lamp (HID lamp) such as a xenon lamp and an ultra-high pressure mercury lamp has been used so far. As an example, a principle of a projector is described with reference to FIG. 7 that is a diagram for explaining a part of one kind of existing projectors (see Japanese Unexamined Patent Application Publication No. 2004-252112, etc.).

Light from a light source (SjA) that is formed of a high luminance discharge lamp or the like enters an incident end (PmiA) of a homogenizing means (FmA) with the help of focusing means (illustration thereof is omitted) that is formed of a concave reflector, lens, or the like, and entering light is output from an exit end (PmoA). Here, as the homogenizing means (FmA), for example, a light guide may be used. The light guide is also referred to as a rod integrator, a light tunnel, or the like, and is configured of a prism formed of a light transmissive material such as glass and a resin. The light entering the incident end (PmiA) is totally reflected repeatedly by side surfaces of the homogenizing means (FmA) and propagates through the homogenizing means (FmA), in accordance with the principle same as that of the optical fiber. Accordingly, even if distribution of light entering the incident end (PmiA) has unevenness, the homogenizing means (FmA) functions to sufficiently uniformize illuminance on the exit end (PmoA).

Note that, in addition to the light guide configured of a prism formed of a light transmissive material such as glass and a resin described above, there is a light guide that is a hollow square tube and whose inner surface is configured of a reflector. The light guide of this type performs the same function as that of the light guide configured of a prism, by propagating light while allowing the light to be reflected repeatedly by the inner surface.

An illumination lens (Ej1A) is disposed such that a square image of the exit end (PmoA) is formed on a two-dimensional light intensity modulator (DmjA). As a result, the two-dimensional light intensity modulator (DmjA) is illuminated with the light output from the exit end (PmoA). Incidentally, in FIG. 7, a mirror (MjA) is disposed between the illumination lens (Ej1A) and the two-dimensional light intensity modulator (DmjA). The two-dimensional light intensity modulator (DmjA) then so modulates the light as to direct the modulated light to a direction entering the image projection lens (Ej2A) or to a direction not entering the image projection lens (Ej2A) for each pixel, to display an image on a screen (Tj).

The two-dimensional light intensity modulator as described above is also referred to as a light valve. In the case of the optical system of FIG. 7, normally, DMD (trademark, digital micro-mirror device) is often used as the two-dimensional light intensity modulator (DmjA).

In addition to the above-described light guide, the homogenizing means includes a fly eye integrator. A principle of a projector using the fly eye integrator as the homogenizing means is described with reference to FIG. 8, as an example. FIG. 8 is a diagram for explaining a part of one kind of existing projectors (see Japanese Unexamined Patent Application Publication No. 2001-142141, etc.).

Light from a light source (SjB) configured of a high luminance discharge lamp or the like enters, as substantially parallel luminous flux, an incident end (PmiB) of homogenizing means (FmB) configured of a fly eye integrator with the help of collimator means (illustration thereof is omitted) formed of a concave reflector, lens, or the like, and resultant light is output from an exit end (PmoB). Here, the homogenizing means (FmB) is configured of a combination of a front fly eye lens (F1B) on incident side, and a rear fly eye lens (F2B) and an illumination lens (Ej1B) on exit side. Each of the front fly eye lens (F1B) and the rear fly eye lens (F2B) is formed by arranging a plurality of square lenses that has the same focusing distance and the same shape, vertically and horizontally.

Each of the front fly eye lenses (F1B) and the rear fly eye lens (F2B) corresponding thereto configure Kohler illumination optical system. A plurality of Kohler illumination optical systems is thus arranged vertically and horizontally. Typically, Kohler illumination optical system is configured of two lenses, and a front lens collects light to illuminate a target surface (a surface desired to be illuminated) uniformly. At this time, the two lenses are disposed so that the front lens forms a light source image not on the target surface but on a center of a surface of a rear lens and the rear lens forms an image of an outer square shape of the front lens on the target surface. The action of the rear lens is to prevent phenomenon in which illuminance in the periphery of the square image formed on the target surface is dropped depending on the size of the light source when the light source is not a complete point light source but has a finite size. The phenomenon occurs when the rear lens is not provided. It is possible to uniform illuminance over the periphery of the square image on the target surface by the action of the rear lens, without depending on the size of the light source.

Here, in the case of the optical system in FIG. 8, substantially parallel luminous flux basically enters the homogenizing means (FmB). Therefore, the front fly eye lens (F1B) and the rear fly eye lens (F2B) are disposed such that a distance therebetween becomes equal to the focusing distance thereof, and therefore, an image on the target surface of uniform illumination as Kohler illumination optical system is generated to the infinity. Incidentally, since the illumination lens (Ej1B) is disposed on a rear stage of the rear fly eye lens (F2B), the target surface is drawn on a focusing surface of the illumination lens (Ej1B) from the infinity. Each of the plurality of Kohler illumination optical systems arranged vertically and horizontally is parallel to an incident optical axis (ZiB), and luminous flux enters each of the Kohler illumination optical systems substantially axisymmetrically to the center axis thereof. Therefore, output luminous flux is also axisymmetrical. Accordingly, images of the outputs of all of the Kohler illumination optical systems are formed on the same target surface on the focusing surface of the illumination lens (Ej1B) by property of the lens in which light beams entering a lens surface at the same angle are so refracted as to travel toward the same point on the focusing surface irrespective of incident positions of the respective light beams on the lens surface, namely, by Fourier transform function of the lens.

As a result, illumination distributions on the respective lens surfaces of the front fly eye lenses (F1B) are all overlapped, and thus a synthesized square image whose illuminance distribution is more uniform than that in the case of one Kohler illumination optical system, is formed on the incident optical axis (ZiB). When the two-dimensional light intensity modulator (DmjB) is disposed on the position of the synthesized square image, the two-dimensional light intensity modulator (DmjB) that is an illumination target is illuminated with the light output from the exit end (PmoB). In the illumination, a polarization beam splitter (MjB) is disposed between the illumination lens (Ej1B) and the two-dimensional light intensity modulator (DmjB) to reflect the light toward the two-dimensional light intensity modulator (DmjB). The two-dimensional light intensity modulator (DmjB) modulates the light and reflects the modulated light such that the polarization direction of light for each pixel is rotated by 90 degrees or is not rotated, according to a picture signal. As a result, only the rotated light passes through the polarization beam splitter (MjB) and enters an image projection lens (Ej3B), thereby displaying an image on the screen (Tj).

In the case of the optical system in FIG. 8, typically, LCOS (trademark, silicon liquid crystal device) is often used as the two-dimensional light intensity modulator (DmjB). In a case of such a liquid crystal device, only a component of light in a specified polarization direction is effectively modulated. Therefore, a component of light parallel to the specified polarization direction is normally transmitted as is. However, in the optical system in FIG. 8, a polarization aligning device (PcB) that rotates polarization direction of only a component of light perpendicular to the specified polarization direction by 90 degrees and consequently allows all of light to be effectively used may be interposed, for example, on a rear stage of the rear fly eye lens (F2B). In addition, for example, a field lens (Ej2B) may be interposed immediately before the two-dimensional light intensity modulator (DmjB) so that substantially parallel light enters the two-dimensional light intensity modulator (DmjB).

Incidentally, in addition to the reflective two-dimensional light intensity modulator illustrated in FIG. 8, a transmissive liquid crystal device (LCD) is also used with a compatible optical arrangement as the two-dimensional light intensity modulator (see Japanese Unexamined Patent Application Publication No. H10-133303, etc.).

Incidentally, in a common projector, to perform color display of an image, for example, a dynamic color filter such as a color wheel is disposed on the rear stage of the homogenizing means to illuminate the two-dimensional light intensity modulator with color sequential luminous fluxes of R (red), G (green), and B (blue), and color display is thus achieved time-divisionally. Alternatively, an optical system in which a dichroic mirror or a dichroic prism is disposed on the rear stage of the homogenizing means to illuminate the two-dimensional light intensity modulator that is provided independently for each color, with light color-separated to three primary colors R, G, and B, and a dichroic mirror or a dichroic prism is disposed to perform color synthesis of the modulated luminous fluxes of the three primary colors R, G, and B is configured. However, to avoid complication, these are omitted in FIG. 7 and FIG. 8.

However, the high luminance discharge lamp disadvantageously has low conversion efficiency from supplied power to optical power, namely, large heating loss, short lifetime, or the like. As an alternate light source overcoming these disadvantages, a solid-state light source such as an LED and a semiconductor laser has attracted attention in recent years. Among them, the LED has smaller heating loss and longer life time as compared with the discharge lamp. However, light radiated from the LED does not have directivity similarly to the discharge lamp. Thus, usage efficiency of light is disadvantageously low in an application using only light in a certain direction, such as the projector and an exposure apparatus.

On the other hand, the semiconductor laser has a disadvantage that speckle occurs due to high coherency, but the disadvantage is overcome by various technical improvement such as usage of a diffuser plate. Since the semiconductor laser has small heating loss and long lifetime similarly to LED and has high directivity, the semiconductor laser advantageously has high usage efficiency of light in application using only light in a certain direction, such as the projector and the exposure apparatus described above. Moreover, the semiconductor laser utilized high directivity to perform optical transmission by optical fibers with high efficiency. Therefore, it is possible to separate the installation position of the semiconductor laser from the position of a projector or the like using the light. Consequently, it is possible to enhance flexibility of device designing.

Incidentally, even in the case where the same current flows, emission wavelength and light emitting intensity of the semiconductor laser vary due to environment temperature variation or temperature increase by self heating, and due to deterioration associated with the increase of accumulated conduction time. In the case where the semiconductor laser is used for a part or all of the three primary colors R, G, and B as a light source of the projector, color and brightness of the entire image vary due to such variation. Therefore, in the case where the semiconductor laser is applied to a high-fidelity projector, it is necessary to perform stabilization of color, namely, stabilization of white balance and stabilization of brightness.

When white light is fabricated by mixing light from light sources of three primary colors R, G, and B, mixing ratio of the three primary colors may be normally adjusted so that correct white light is obtained, while measuring chromaticity with use of a color meter when a human performs the fabrication manually. On the other hand, in a projector, it is difficult to achieve automatic adjustment with low cost. The above-described color meter is expensive and is not easily incorporated in a projector. Therefore, it is forced to use an inexpensive optical sensor suitable for incorporation. Even if an inexpensive optical sensor is only used, however, a precise spectral filter with high cost is necessary to obtain a function equivalent to that of the color meter. Therefore it is necessary to achieve a configuration in which the spectral filter is in place with an inexpensive filter having simple specification. However, technology in which a quantity correlated with chromaticity is measured with use of an inexpensive optical sensor or filter and supplied power to the semiconductor laser of R, G, and B is efficiently adjusted automatically based on the measurement result has not been established so far.

Technology to avoid disadvantage of phenomenon in which emission wavelength is particularly varied in a case where a semiconductor laser or LED is applied as a light source has been developed. For example, in Japanese Unexamined Patent Application Publication No. 2006-252777, there is disclosed a technology in which it is determined whether gradient of the spectral sensitivity characteristics is varied in a direction with long emission wavelength or in a direction with short emission wavelength, or is not varied, based on light intensity detection that is performed for emission wavelength band of a light source with use of a positive optical sensor and a negative optical sensor, and a reference level of power supply control of light sources of colors R, G, and B is increased or decreased based on the determination result.

In the case of this technology, however, only the direction of the temporal variation of the emission wavelength is detected and controlled. Therefore, color variation at relatively high rate associated with temperature variation caused by heat generation of the light source itself immediately after turning on of the light source is corrected, but the color variation associated with moderate variation of the environment temperature and deterioration of the light source over long term is not corrected disadvantageously. Moreover, power supply control for each of the color light sources in the case where color variation of the light sources of a plurality of colors occurs independently has not been solved.

Further, for example, in Japanese Unexamined Patent Application Publication No. 2007-156211, there is disclosed a technology allowing light sources of the respective colors R, G, and B to emit light color-sequentially. By the technology, white balance is corrected by performing control such that difference between outputs of the optical sensors and the target values thereof becomes small while assuming that the spectral sensitivity distribution of the optical sensors of the respective colors R, G, and B is equivalent to that of the color matching function in the XYZ color system recommended by Commission International de l'Éclairage (CIE).

In the feedback control of the white balance, however, variation of the supplied power of each of the light sources of the three colors to focus the output of the optical sensors to the target values has not been solved.

Moreover, in Japanese Unexamined Patent Application Publication No.

2008-134378, there is disclosed a technology in which an angle of a dichroic mirror is varied based on a detection result of an photodetection sensor that detects output and a color from an LED light source, and undesirable wavelength component of light emitted from the LED is discarded to correct color. However, the technology has low efficiency due to the discard of undesirable light, and a method of achieving a photodetection sensor detecting color is not developed.

SUMMARY

It is desirable to provide a light source unit and a projector that are adapted to quantitatively measure color phase of an output luminous flux with a simple filter and to maintain target color phase through feedback control without incorporating an expensive color meter including a filter that has precise spectral characteristics.

According to an embodiment of the invention, there is provided a light source unit including: a plurality of elemental light sources each including one or more light emitting elements and one or more drive circuits, and each configured to emit output luminous flux to outside, the one or more drive circuits being provided corresponding to the respective light emitting elements and each being configured to drive corresponding light emitting element, the output luminous flux being configured of radiated light from the one or more light emitting elements; a control circuit configured to control the drive circuits; and a plurality of color band light characteristic measurement sections each configured to receive light of a quantity correlated with light intensity of the output luminous flux to generate color band light characteristic measurement data. A plurality of the light emitting elements in the plurality of elemental light sources include a plurality of light emitting elements different in wavelength band of emission wavelength from one another. The plurality of color band light characteristic measurement sections are provided corresponding to a plurality of the wavelength bands. One or more of the plurality of color band light characteristic measurement sections include a first light intensity measurement section and a second light intensity measurement section, the first light intensity measurement section having first spectral sensitivity characteristics in a corresponding wavelength band and generating first light intensity measurement data as the color band light characteristic measurement data, and the second light intensity measurement section having second spectral sensitivity characteristics different in rate of sensitivity varying against wavelength varying from the first spectral sensitivity characteristics and generating second light intensity measurement data as the color band light characteristic measurement data. The control circuit generates light intensity indicating values correlated with light intensity and wavelength deviation indicating values correlated with deviation from normal wavelength, with use of local color band spectral sensitivity information, based on the first light intensity measurement data and the second light intensity measurement data, the local color band spectral sensitivity information including sensitivity value at the normal wavelength and the rate of sensitivity varying against wavelength varying for each of the first and second spectral sensitivity characteristics. The control circuit generates color phase indicating values correlated with color of integrated light of the output luminous flux and performs first feedback control on the drive circuits to allow a difference between the color phase indicating values and target values to be small, with use of the wavelength deviation indicating values and local color band color matching function information, the local color band color matching function information including function values of a color matching function at the normal wavelength and rate of the color matching function output varying against wavelength varying.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Figure 1:
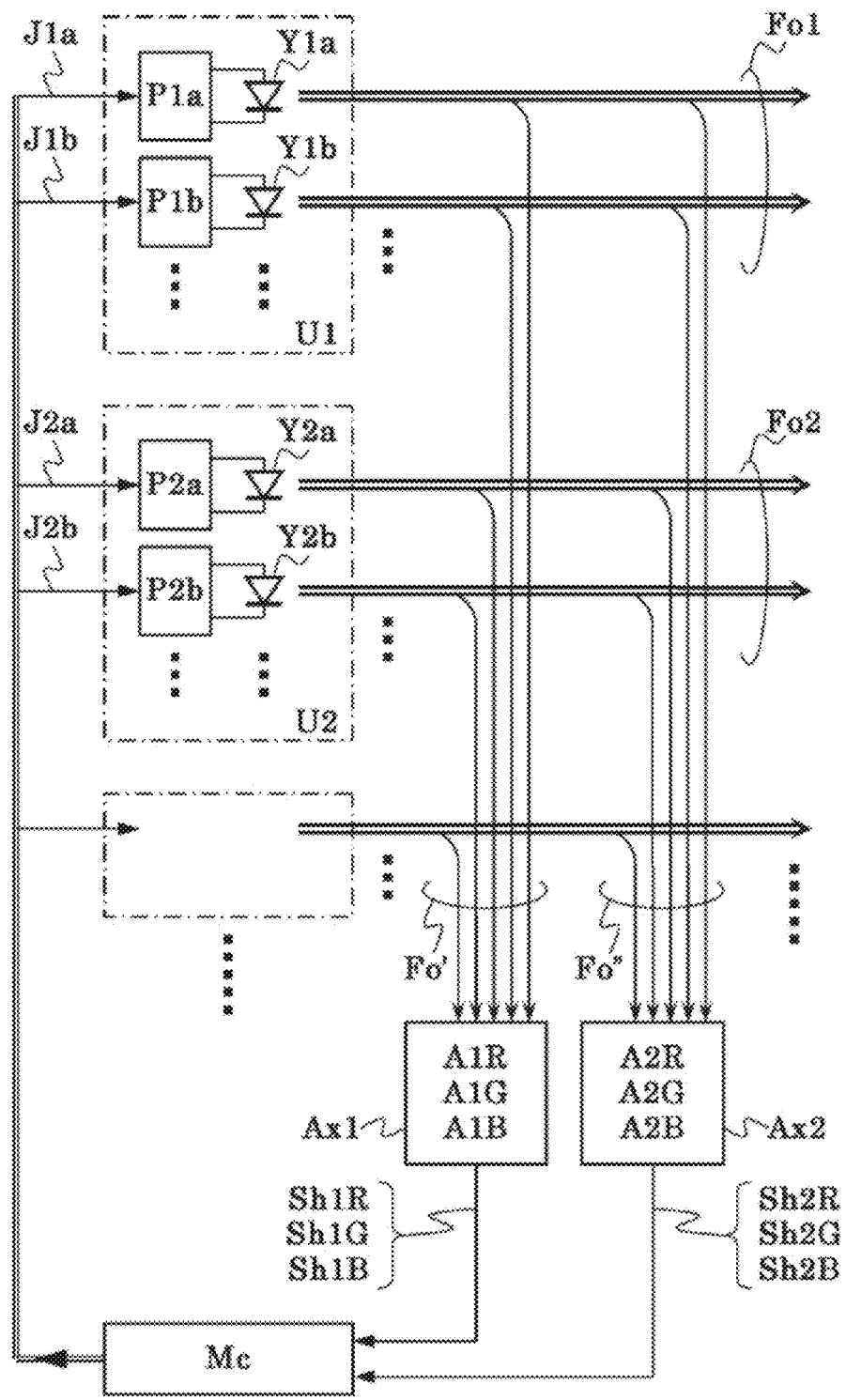
FIG. 1 is a block diagram illustrating a light source unit according to an embodiment of the invention in a simplified manner.

First, an embodiment of the invention is described with reference to FIG. 1 that is a block diagram illustrating a light source unit according to an embodiment of the invention in a simplified manner. One or more light emitting elements (Y1a, Y1b, . . . ) provided in an elemental light source (U1) are respectively driven by drive circuits (P1a, P1b, . . . ) and emit light. Note that each of the light emitting elements (Y1a, Y1b, . . . ) may be a light source or the like that converts, for example, a wavelength of semiconductor laser or radiated light of a semiconductor laser with use of non-linear optical phenomenon such as harmonic generation and optical parametric effect. The light emitting elements (Y1a, Y1b, . . . ) may be driven by a single drive circuit (P1a, P1b, . . . ) by connecting a plurality of such light sources in series, in parallel, or in series-parallel.

Moreover, each of the drive circuits (P1a, P1b, . . . ) may be a DC/DC converter that is fed with power by a DC power source (not illustrated) and configured of, for example, a step-down chopper circuit or a step-up chopper circuit. The drive circuits (P1a, P1b, . . . ) supply predetermined power to the respective light emitting elements (Y1a, Y1b, . . . ).

A control circuit (Mc) independently controls the drive circuits (P1a, P1b, . . . , P2a, P2b, . . . ) through respective drive circuit control signals (J1a, J1b, . . . , J2a, J2b, . . . ) to supply the predetermined power to the respective light emitting elements (Y1a, Y1b, . . . , Y2a, Y2b, . . . ).

The light source unit according to the embodiment of the invention includes a plurality of elemental light sources similar to the elemental light source (U1). The light emitting elements (Y1a, Y1b, . . . , Y2a, Y2b, . . . ) included in the plurality of elemental light sources include light emitting elements included in a plurality of kinds of narrow wavelength bands that are different in emission wavelength. The included wavelength bands here are three primary colors R, G, and B.

Accordingly, to measure integral light characteristics of output luminous fluxes (Fo1, Fo2, . . . ) of the respective elemental light sources (U1, U2, . . . ), measurement-use output luminous fluxes (Fo', Fo'') are generated and are allowed to enter a color band light characteristic measurement means that are provide for the respective wavelength bands. The measurement-use output luminous fluxes (Fo', Fo'') are each formed of light of a quantity correlated with the light intensity of the output luminous fluxes (Fo1, Fo2, . . . ) that include parts of the respective output luminous fluxes (Fo1, Fo2, . . . ) extracted and collected.

The integral light characteristics indicate, assuming a state where all of the output luminous fluxes (Fo1, Fo2, . . . ) are mixed, characteristics to the entire output luminous fluxes (Fo1, Fo2, . . . ), such as content percentage of light for each of the wavelength bands and shade of light for each of the wavelength bands in the entire output luminous fluxes (Fo1, Fo2, . . . ). This is because, for example, when the light source unit according to the embodiment of the invention is applied to a projector, the light of the wavelength bands R, G, and B are finally mixed after image information is added to the light of the wavelength bands R, G, and B for each of the wavelength bands through two-dimensional light intensity modulation in a case where the output luminous fluxes (Fo1, Fo2, . . . ) mix and output the light of the wavelength bands R, G, and B and even in a case where the output luminous fluxes (Fo1, Fo2, . . . ) output the light of the wavelength bands R, G, and B separately.

Further, correlation with the light intensity of the output luminous flux indicates that the light quantity and shade for each wavelength band of the output luminous fluxes (Fo1, Fo2, . . . ) are presumable through measurement of the measurement-use output luminous fluxes (Fo', Fo''). At this time, magnification of the correlation (a correlation coefficient) may be different for each of the wavelength bands because being correctable by previous measurement, and the magnification of the correlation may be different between two measurement-use output luminous fluxes (Fo', Fo'') for the same reason.

The color band light characteristic measurement means is to measure light emitting intensity indicating values correlated with light intensity and wavelength deviation indicating values correlated with deviation from normal wavelength. In the light source unit of the embodiment of the invention, the color band light characteristic measurement means for one or more of the above-described wavelength bands includes a first light intensity measurement means that has first spectral sensitivity characteristics of the corresponding wavelength band and a second light intensity measurement means that has second spectral sensitivity characteristics of the corresponding wavelength band. The description is given while assuming that all of the color band light characteristic measurement means are configured as described above.

Note that the color band light characteristic measurement means with the other configuration may be used with respect to any of the above-described wavelength bands. This will be described later.

Accordingly, in the light source unit in FIG. 1, the measurement-use output luminous flux (Fo') enters the first light intensity measurement means (A1R, A1G, A1B) that are provided for the above-described respective wavelength bands, and the measurement-use output luminous flux (Fo'') enters the second light intensity measurement means (A2R, A2G, A2B) that are provided for the above-described respective wavelength bands.

In FIG. 1, the first light intensity measurement means (A1R, A1G, A1B) for the respective wavelength bands R, G, and B are grouped into a first light intensity measurement means group (Ax1) for convenience. Also, the second light intensity measurement means (A2R, A2G, A2B) for the respective wavelength bands R, G, and B are grouped into a second light intensity measurement means group (Ax2) for convenience. For example, the first light intensity measurement means for R-color and the second light intensity measurement means for R-color may be grouped, the first light intensity measurement means for G color and the second light intensity measurement means for G-color may be grouped, and the first light intensity measurement means for B-color and the second light intensity measurement means for B-color may be grouped.

Further, in FIG. 1, the measurement-use output luminous flux (Fo', Fo'') that are configured by integrating extracted parts of the respective output luminous fluxes (Fo1, Fo2, . . . ) for the respective wavelength bands is formed. However, the measurement-use output luminous fluxes for the respective wavelength bands may independently enter the color band light characteristics measurement means for the respective wavelength bands.

For example, in the case of the above-described projector, the output luminous fluxes (Fo1, Fo2, . . . ) may be used so as to illuminate the two-dimensional light intensity modulator provided independently for each of colors R, G, and B and as to perform color synthesis of modulated luminous fluxes of the three primary colors R, G, and B with use of a disposed dichroic mirror or a disposed dichroic prism. Alternately, all of the output luminous fluxes (Fo1, Fo2, . . . ) are mixed, and the mixed output luminous fluxes as white light may be used as alternate of light from the light source (SjA) that is configured of the above-described high-luminance discharge lamp or the like.

Figure 2:
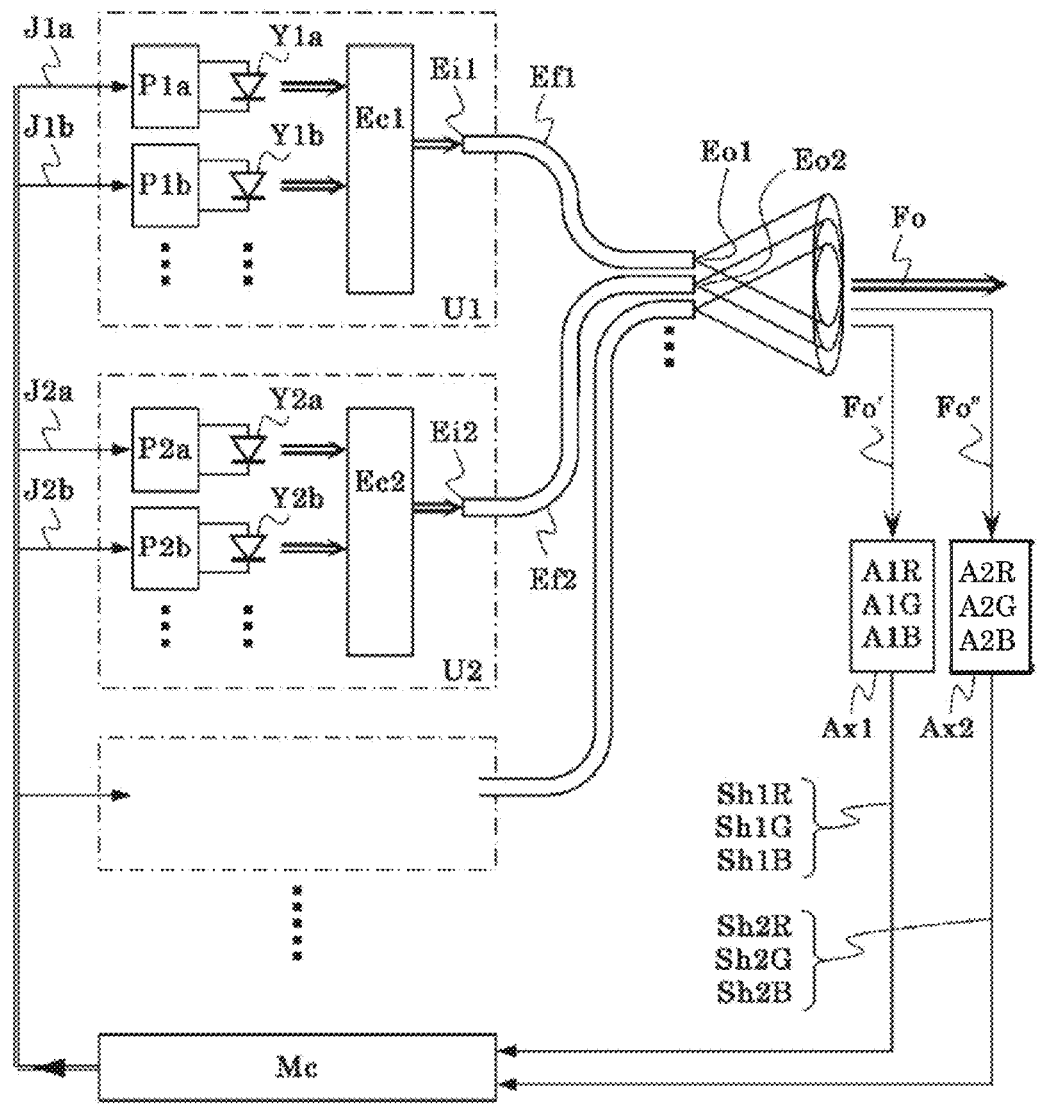
FIG. 2 is a block diagram illustrating a light source unit according to an embodiment of the invention in a simplified manner.

Alternatively, as illustrated in FIG. 2 that is a block diagram illustrating a light source unit according to an embodiment of the invention in a simplified manner, light emitted from the light emitting elements (Y1$a$, Y1$b$, . . . , Y2$a$, Y2$b$, . . . ) may be focused on incident ends (Ei1, Ei2, . . . ) of respective optical fibers (Ef1, Ef2, . . . ) by focusing optical systems (Ec1, Ec2, . . . ) each configured of, for example, a lens, and focused light propagates through cores of the respective optical fibers (Ef1, Ef2, . . . ) so as to be radiated from the exit ends (Eo1, Eo2, . . . ).

The radiated light from the exit ends (Eo1, Eo2, . . . ) of the respective optical fibers (Ef1, Ef2, . . . ) of the respective elemental light sources (U1, U2, . . . ) are integrated, and integrated light is output from the light source unit according to the embodiment of the invention, as a single output luminous flux (Fo).

To integrate the radiated light from the plurality of exit ends (Eo1, Eo2, . . . ), exit ends of the respective optical fibers (Ef1, Ef2, . . . ) are bundled such that the exit ends (Eo1, Eo2, . . . ) are aligned so as to be positioned on the same plane, that is the simplest way.

To measure a quantity correlated with light intensity of the output luminous flux (Fo) that is guided by each of the optical fibers (Ef1, Ef2, . . . ), the measurement-use output luminous fluxes (Fo', Fo") that are each formed by integrating extracted parts of the respective radiated light from the respective output ends (Eo1, Eo2, . . . ) are generated. Similarly to those in FIG. 1, the measurement-use output luminous flux (Fo') enters the first light intensity measurement means group (Ax1) that is group of the first light intensity measurement means (A1R, A1G, A1B) and the measurement-use output luminous flux (Fo") enters the second light intensity measurement group (Ax2) that is group of the second light intensity measurement means (A2R, A2G, A2B).

Note that the case where the exit ends of all of the optical fibers (Ef1, Ef2, . . . ) are bundled to generate the output luminous flux (Fo) of white light is described here; however, the exit ends (Eo1, Eo2, . . . ) may be bundled separately for each of the wavelength bands R, G, and B to generate the output luminous fluxes of the respective wavelength bands, and the generated output luminous fluxes may individually enter the color band light characteristic measurement means.

Figure 3:
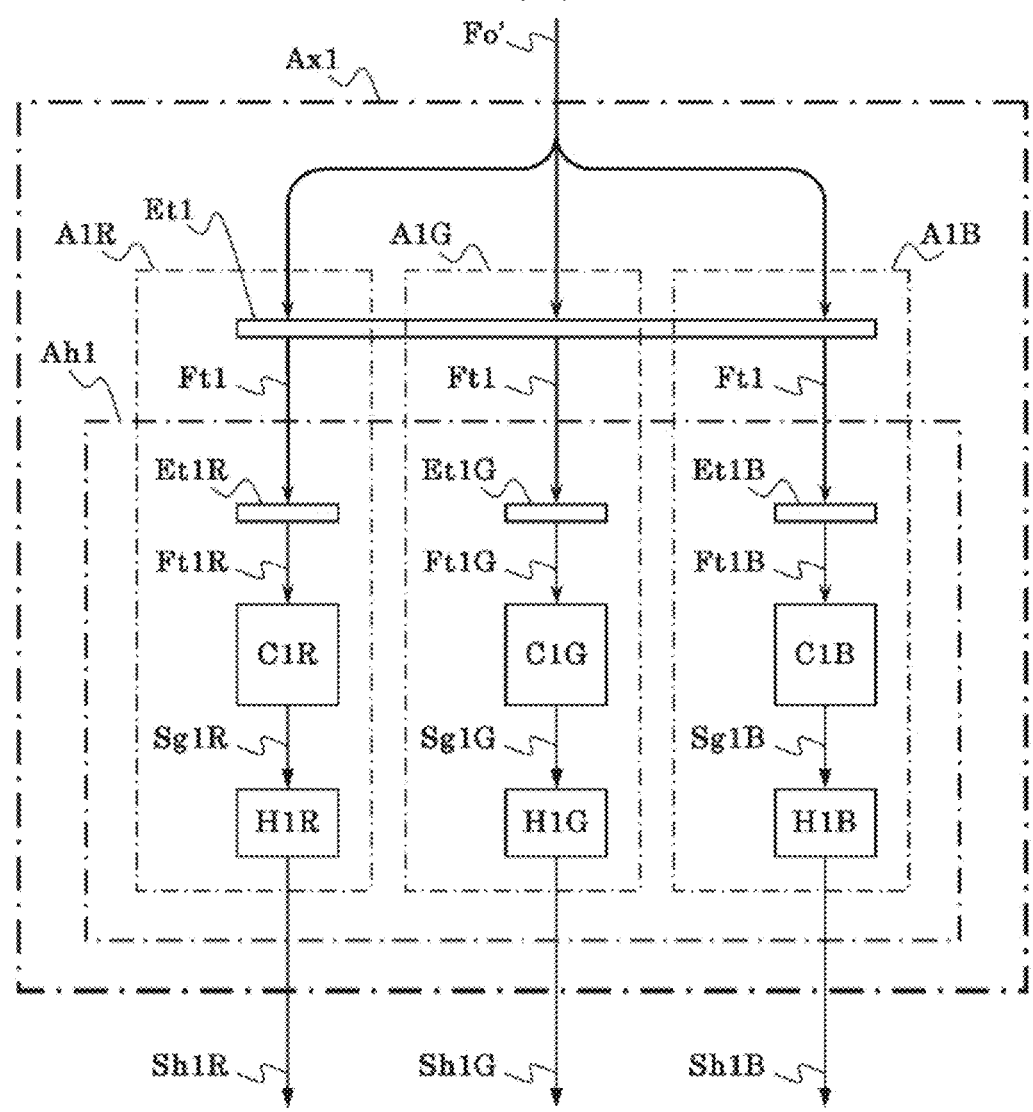
FIG. 3 is a block diagram illustrating a part of the light source unit according to an embodiment of the invention in a simplified manner.

As illustrated in FIG. 3 that is a block diagram illustrating a part of the light source unit according to the embodiment of the invention in a simplified manner, in the first light intensity measurement means (A1R, A1G, A1B), the measurement-use output luminous flux (Fo') enters a light characteristic filter (Et1), and a measurement-use output luminous flux (Ft1) that has passed through the light characteristic filter is received by each of optical sensors for respective colors (C1R, C1G, C1B) through a band filter of each of three colors R, G, and B (Et1R, Et1G, Et1B).

Photodetection signals (Sg1R, Sg1G, Sg1B) from the respective optical sensors (C1R, C1G, C1B) are subjected to necessary processing such as amplification and AD conversion by respective light intensity measurement circuits H1R, H1G, and H1B. As a result, first light intensity measurement data (Sh1R, Sh1G, Sh1B) that are each formed of information of light intensity in each of the wavelength bands R, G, and B are generated.

In addition to the spectral sensitivity characteristics caused by the light characteristic filter (Et1) and the color band filters (Et1R, Et1G, Et1B), spectral sensitivity characteristics of the optical sensors (C1R, C1G, C1B) are reflected in the spectral sensitivity characteristics of the first light intensity measurement means (A1R, A1G, A1B).

The light characteristic filter (Et1) that is provided commonly to the first light intensity measurement means (A1R, A1G, A1B) is described; however, the light characteristic filter may be provided individually for each of the first light intensity measurement means (A1R, A1G, A1B).

a. Further, the light intensity measurement circuit (H1R, H1G, H1B) that are provided individually for the respective photodetection signals (Sg1R, Sg1G, Sg1B) are described; however, the light intensity measurement circuit may be provided commonly to the photodetection signals (Sg1R, Sg1G, Sg1B) with an analog multiplexer that selects one of the photodetection signals (Sg1R, Sg1G, Sg1B) according to a selection signal.

The same applies to the second light intensity measurement means (A2R, A2G, A2B). The second light intensity measurement means (A2R, A2G, A2B) may include, in place of the light characteristic filter (Et1), a light characteristic filter (Et2) different in spectral sensitivity characteristics from the light characteristic filter (Et1), and the rear stage subsequent to the light characteristic filter (Et2) of the second light intensity measurement means (A2R, A2G, A2B) may be configured using an optical sensor circuit section same as the optical sensor circuit section (Ah1) of the first light intensity measurement means (A1R, A1G, A1B) that is configured of the color band filters (Et1R, Et1G, Et1B), the optical sensors (C1R, C1G, C1B), and the light intensity measurement circuits (H1R, H1G, H1B). It is accordingly possible to generate second light intensity measurement data (Sh2R, Sh2G, Sh2B).

Then, the control circuit (Mc) may read the first light intensity measurement data (Sh1R, Sh1G, Sh1B) and the second light intensity measurement data (Sh2R, Sh2G, Sh2B).

The light characteristic filter (Et1) and the color band filters (Et1R, Et1G, Et1B) of the first light intensity measurement means (A1R, A1G, A1B) may not be separated, and each of the color band filters (Et1R, Et1G, Et1B) may be configured to further have a function of the light characteristic filter (Et1). The same applies to the color band filters of the second light intensity measurement means (A2R, A2G, A2B).

In addition, the light characteristic filter of one of the light intensity measurement means (A1R, A1G, A1B) and the second light intensity measurement means (A2R, A2G, A2B) may be transparent. As described with reference to FIG. 1 above, in the case where the output luminous fluxes (Fo1, Fo1, . . . ) are used independently for each of colors R, G, and B, each of the optical sensors (C1R, C1G, C1B)

is not collectively mounted in the optical sensor circuit (Ah1) but may be configured separately.

Regarding the first spectral sensitivity characteristics of the first light intensity measurement means (A1R, A1G, A1B) and the second spectral sensitivity characteristics of the second light intensity measurement means (A2R, A2G, A2B) for each of the wavelength bands R, G, and B, it is sufficient to achieve a state in which a rate of sensitivity varying against wavelength varying, namely, gradient of sensitivity varying at the time of wavelength varying are different in each of the wavelength bands. Specifically, when expressions 8, 9, and 10 described later are regarded as simultaneous linear equation with two unknowns relating to Sr and Sr·ΔλJ, Sg and Sg·Δλg, and Sb and Sb·Δλb, respectively, it is sufficient to achieve a state in which a determinant of each expression is not zero. In this case, the spectral sensitivity characteristics indicate a set of the spectral sensitivity characteristics of the R-color wavelength band, the spectral sensitivity characteristics of the G-color wavelength band, and the spectral sensitivity characteristics of the B-color wavelength band. Incidentally, examples of a case of difference of the rate of sensitivity varying against wavelength varying in one wavelength band may include a case in which one of the first spectral sensitivity characteristics and the second spectral sensitivity characteristics is positive and the other is negative, one of them is substantially zero and the other is not zero (a finite value), and a case where both of them have the same symbol but the absolute values thereof are different from each other. Any case may be possible.

Restriction of the rate of sensitivity varying against wavelength varying is limited to within a bandwidth that is defined by an upper limit and a lower limit of the wavelength varying caused by fluctuation of the light emitting elements (Y1a, Y1b, ..., Y2a, Y2b, ...) mounted on the light source unit and emission wavelength variation in the expected temperature range. The spectral sensitivity characteristics outside the bandwidth do not matter. When, out of the light emitting elements (Y1a, Y1b, ..., Y2a, Y2b, ...), the light emitting elements used for one wavelength band are unified to the same products manufactured by the same manufacturer, the bandwidth is normally about several nanometer to about ten nanometer. Regarding the first spectral sensitivity characteristics and the second spectral sensitivity characteristics, however, variation of the rate of sensitivity varying against wavelength varying in the bandwidth may be desirably small.

The control circuit (Mc) has local color band spectral sensitivity information that is configured of the sensitivity value at normal wavelength and the rate of sensitivity varying against wavelength varying for each of the wavelength bands R, G, and B, regarding each of the first spectral sensitivity characteristics and the second spectral sensitivity characteristics. Accordingly, as will be described later, the control circuit (Mc) uses the local color band spectral sensitivity information to approximately calculate the light emitting intensity indicating values correlated with the light intensity and the wavelength deviation indicating values correlated with the deviation from normal wavelength for the respective wavelength bands R, G, and B, based on the first light intensity measurement data (Sh1R, Sh1G, Sh1B) read from the first light intensity measurement means (A1R, A1G, A1B) and the second light intensity measurement data (Sh2R, Sh2G, Sh2B) read from the second light intensity measurement means (A2R, A2G, A2B).

Typically, the color of light emitted from a light source or the like is represented by chromaticity coordinate based on XYZ color system recommended by CIE (The Japan Society of Applied Physics/The Optical Society of Japan (1986) "Characteristics and Technologies of Color", published by Asakura Publishing Co., Ltd.). The tristimulus values X, Y, and Z of the luminous flux to be measured represented by spectrum $S(\lambda)$ having the wavelength $\lambda$ as a parameter are determined by integration of the following expression (expression 1), with use of the color matching functions $xe(\lambda)$, $ye(\lambda)$, and $ze(\lambda)$ defined by CIE.

$$X = \int S(\lambda) \cdot xe(\lambda) \cdot d\lambda$$

$$Y = \int S(\lambda) \cdot ye(\lambda) \cdot d\lambda$$

$$Z = \int S(\lambda) \cdot ze(\lambda) \cdot d\lambda \qquad \text{Expression 1}$$

Incidentally, the integration is performed in a region of wavelength from about 380 nm to about 780 nm. With use of the tristimulus values X, Y, and Z, the chromaticity coordinates x and y of the luminous flux to be measured SQL) is determined by the following expression (Expression 2).

$$x = X/[X+Y+Z]$$

$$y = Y/[X+Y+Z] \qquad \text{Expression 2}$$

Figure 4A:
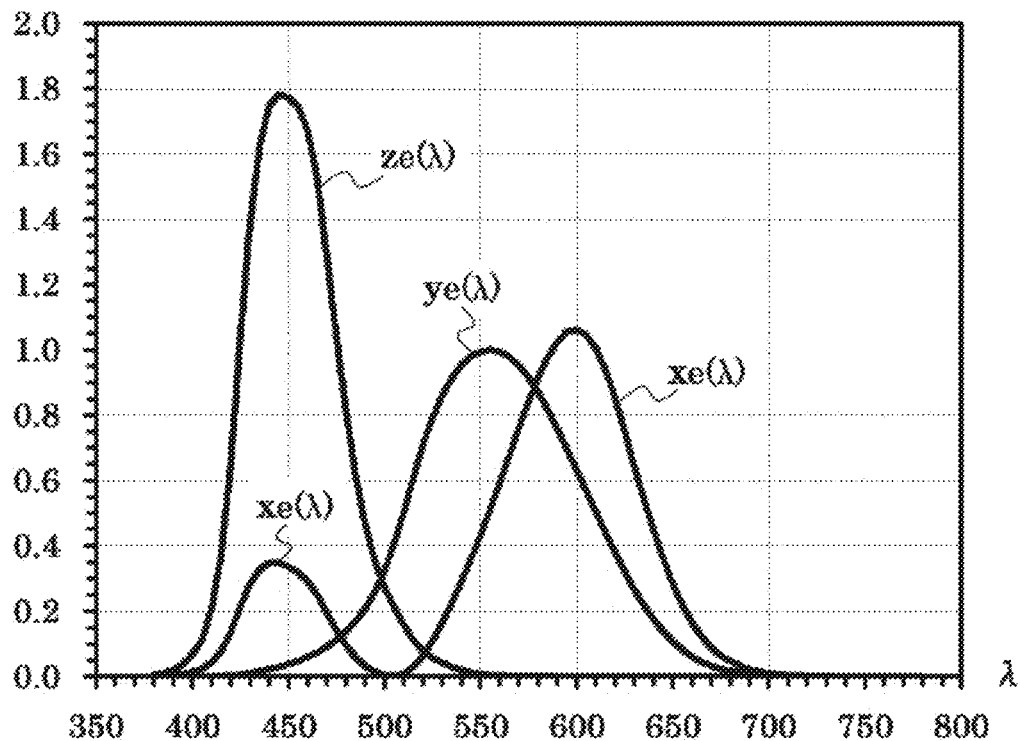
FIGS. 4A and 4B are schematic diagrams of concept relating to the technology of the light source unit according to the embodiment of the invention.
Figure 4B:
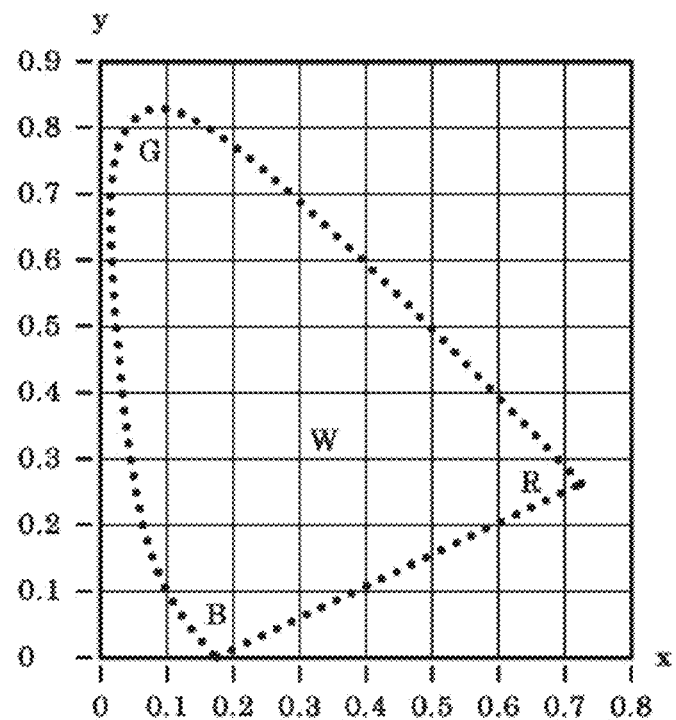

The color matching functions $xe(\lambda)$, $ye(\lambda)$, and $ze(\lambda)$ have the characteristics illustrated in FIG. 4B that is a schematic diagram of concept relating to the technology of the light source unit according to the embodiment of the invention. Incidentally, although symbols of characters x, y, and z attached with upper horizontal line are used in the color matching function in general documents, the symbols of the color matching functions in the present specification are denoted as described above for certain reasons.

The control circuit (Mc) has local color band color matching function information that is configured of a function value at normal wavelength and a rate of function output varying against wavelength varying for each of the color matching functions $xe(\lambda)$, $ye(\lambda)$, and $ze(\lambda)$ for each of the wavelength bands R, G, and B. Accordingly, as will be described later, the control circuit (Mc) uses the local color band color matching function information to approximately calculate the tristimulus values X, Y, and Z or the chromaticity coordinates x and y as color phase indicating values, based on the light emitting intensity indicating values and the wavelength variation indicating values that are calculated for each of the wavelength bands R, G, and B.

FIG. 4B is a schematic diagram illustrating so-called chromaticity diagram that illustrates relationship between chromaticity coordinates and colors. All of colors representable in the color system are located on or inside a dashed line in FIG. 4B. In FIG. 4B, schematic positions of red (R), green (G), blue (B), and white (W) are illustrated. Note that a single-color light such as a laser beam is located on the dashed line in the figure except for a straight line from R to B that is so-called pure purples. The chromaticity coordinates of pure white are 1/3 and 1/3.

In FIG. 4B, when the position of white is viewed as a reference, R, G, and B are substantially located on right side, upper side, and lower side, respectively. Therefore, in the chromaticity coordinates of the white light, the value x increases with the increase of R component, the value y increases with the increase of G component, and the value y decreases with the increase of B component.

Accordingly, the control circuit (Mc) acquires the first light intensity measurement data (Sh1R, Sh1G, Sh1B) and the second light intensity measurement data (Sh2R, Sh2G, Sh2B) respectively from the first light intensity measurement means (A1R, A1G, A1B) and the second light intensity measurement means (A2R, A2G, A2B) to calculate the chromaticity coordinates, and compares the values x and y of the calculated chromaticity coordinates with the respective target values.

For example, when the value x is larger than the target value, the control circuit (Mc) decreases the total output power of the drive circuits driving the light emitting elements of the R wavelength band, out of the drive circuits (P1a, P1b, . . . , P2a, P2b, . . . ), by p %, and increases each of the total output power of the drive circuits driving the light emitting elements of the G wavelength band and the total output power of the drive circuits driving the light emitting elements of the B wavelength band by [p/2]%, through the drive circuit control signals (J1a, J1b, . . . , J2a, J2b, . . . ). Also, when the value y is larger than the target value, the control circuit (Mc) decreases the total output power of the driving circuits driving the light emitting elements of the G wavelength band by q % and increases the total output power of the driving circuits driving the light emitting elements of the B wavelength band by q %, through the drive circuit control signals (J1a, J1b, . . . , J2a, J2b, . . . ).

Then, after appropriate length of time is elapsed, the sequence is returned to a step of acquiring the light intensity measurement data again, to establish the feedback control loop. By the feedback control loop, the control is constantly performed so that the difference between the chromaticity coordinates and the target values thereof is small with less variation of light intensity. This makes it possible to stabilize the color of light.

Incidentally, when the value x or the value y is smaller than the target value, the operation of increase and the operation of decrease as described above are reversed. In addition, the value p and the value q should be small values not causing drastic variation of the color of light. The relationship between the value p with respect to the difference between the value x and the target value thereof and the value q with respect to the difference of the value y and the target value thereof may be preferably determined experimentally. Note that the increase and decrease of the output power based on the value p and the increase and decrease of the output power based on the value q may be alternately performed. Alternatively, after the values p and q are determined, the increase and decrease of the output power reflecting the both values p and q may be performed.

The method of increasing and decreasing the total output power of the drive circuits driving the light emitting elements of each of the wavelength bands R, G, and B based on the values q and p, is not necessarily a method of approaching the target values through the shortest route, but is a method through trial and error. However, since the state of the system may be gradually changed toward the target values by the feedback control, the above-described method is sufficiently practical. Incidentally, the method of approaching the target values through the shortest route will be described later.

The chromaticity coordinates corresponding to pure white is not necessarily favorable as the target chromaticity coordinates. This is because, for example, when the light source unit according to the embodiment of the invention is applied to a projector, usage efficiency of light of an optical system in the projector is not necessarily the same in colors R, G, and B. For example, if the usage efficiency of B-color is low in the optical system in a projector, the target chromaticity coordinates may become bluish chromaticity coordinates including extra B-color component. Accordingly, the target chromaticity coordinates may be determined not based on the color of the output luminous fluxes (Fo, Fo1, Fo2, . . . ) of the light source unit but on the output of an apparatus that uses the light source unit.

Here, property in which the total output power of the drive circuits driving the light emitting elements of one wavelength band and the light intensity of the component of the one wavelength band are substantially proportionally correlated with each other is used (in the specification, the property is called electric power and light intensity proportion rule). More specifically, property in which, out of the drive circuits (P1a, P1b, . . . , P2a, P2b, . . . ), the total output power Pr of the drive circuits driving the light emitting elements of the R wavelength band, the total output power Pg of the drive circuits driving the light emitting elements of the G wavelength band, and the total output power Pb of the drive circuits driving the light emitting elements of the B wavelength band are substantially proportionally correlated with the light intensity of the component of the respective wavelength bands R, G, and B is used. As the premise thereof, it is assumed that the light emitting elements emitting the same color light have the same emission efficiency (more pragmatically, the same kind of products by the same manufacturer) although the emission efficiency may be different between the light emitting elements emitting different color light.

There is a case where the above-described premise is not applied due to the fact that a plurality of light emitting elements different in emission efficiency are mixed although the light emitting elements emit the same color light. For example, it is assumed that there are light emitting elements of a kind A that are high in emission efficiency and light emitting elements of a kind B that are lower in emission efficiency by 10% than the light emitting elements of the kind A. When receiving power setting instruction from the control circuit (Mc) through the drive circuit control signals (J1a, J1b, . . . , J2a, J2b, . . . ), the drive circuits driving the light emitting elements of the kind B internally set the power larger by 10% than the instructed setting power, etc. to easily address the case.

Note that proportional accuracy in the above-described electric power and light intensity proportion rule, namely, linearity does not a matter. This is because it is possible to gradually change the state of the system toward the target values through the feedback control by varying the power as long as the increase of the power and the increase of the light intensity are correlated with each other even if the linear relationship therebetween is not established.

Further, if there are a plurality of target drive circuits when the total output power of the drive circuits driving the light emitting elements of the one wavelength band, all of the drive circuits may be changed at the same rate or different rates, or only specified drive circuits may be varied. The power setting to the drive circuit is limited in level. For example, when the setting data length is 8 bits, the grayscale is 256. Therefore, when the power is increased by minimum unit, the power setting of all of the drive circuits are not increased by 1LSB at a time. The power setting of the drive circuits are separately increased in such a manner that, for example, the power setting of a first drive circuit is increased by 1LSB, then the power setting of a second drive circuit is increased by 1LSB, and when the power setting of a final drive circuit is increased by 1LSB, the power setting of the first drive circuit is increased again by 1LSB, and the increase is continued. As a result, it is advantageously possible to increase the number of grayscale of the power setting to multiple of the number of the drive circuits.

The XYZ color system recommended by CIE is configured such that the value Y in the expression 1 represents the brightness of the integrated light of all of the included wavelength bands. Accordingly, when the brightness of the light integrated of all of the wavelength bands R, G, and B is also stabilized in addition to the color phase indicating values correlated with the color of light, the control circuit (Mc) compares the calculated value Y as the brightness indicating value with the target value. When the value Y is larger than the target value, according to the electric power and light intensity proportion rule, the control circuit (Mc) decreases, out of the drive circuits (P1a, P1b, . . . , P2a, P2b, . . . ), each of the total output power Pr of the driving circuits driving the light emitting elements of the R wavelength band, the total output power Pg of the drive circuits driving the light emitting elements of the G wavelength band, and the total output power Pb of the drive circuits driving the light emitting elements of the B wavelength band, by Q % through the drive circuit control signals (J1a, J1b, . . . , J2a, J2b, . . . ). As a result, it is possible to stabilize the brightness of light without varying the color of light by performing the feedback control in a direction in which the difference between the brightness of light and the target value becomes small.

Incidentally, if the value Y is smaller than the target value, the operation of increase and the operation of decrease described above are reversed.

Further, the value Q should be a small value not causing drastic variation of the brightness of light. The relationship of the value Q to the difference between the value Y and the target value thereof may be preferably determined experimentally. The increase and decrease of the output power to stabilize the brightness of light described here and the increase and decrease of the output power to stabilize the color of light may be alternately performed. Alternatively, after the values p, q, and Q are each determined, the increase and decrease of the output power reflecting the three values may be performed.

In the detection of the difference between the chromaticity coordinates x and y and the brightness Y and the respective target values, the method of increasing and decreasing the total output power of the drive circuits driving the light emitting elements of each of the wavelength bands R, G, and B based on the values q, p, and Q is not necessarily a method of approaching the target values through the shortest route, but is a method through trial and error. However, since the state of the system may be gradually changed toward the target values by the feedback control, the above-described method is also sufficiently practical. Incidentally, the method of approaching the target values through the shortest route will be described later.

The feedback control to stabilize the color of light and the brightness of light described above is trial and error procedure because guideline to quantitatively determine variation of the output power of the drive circuits corresponding to each of the wavelength bands R, G, and B in order to cause the values x, y, and Y to integrally direct toward the respective target values is not shown. Here, the guideline to achieve feedback control improved in this point is described.

As described above, the control circuit (Mc) measures the light emitting intensity indicating values correlated with the light intensity, based on the first light intensity measurement data (Sh1R, Sh1G, Sh1B) and the second light intensity measurement data (Sh2R, Sh2G, Sh2B) that are the color band light characteristic measurement data from the color band light characteristic measurement means.

Here, the light intensity correlates with light power of all of the light emitting elements included in one of the wavelength bands, out of the light emitting elements (Y1a, Y1b, . . . , Y2a, Y2b, . . . ). Therefore, the light intensity has no relation to human visibility. On the other hand, since the brightness of light is brightness sensed by a human, the brightness of light varies due to influence of visibility of a human when a wavelength varies even in the case of the same light power (density).

The control circuit (Mc) determines a coefficient of a linear operation with use of the light emitting intensity indicating values and the wavelength deviation indicating values. The linear operation represents, with use of the variation of the light emitting intensity indicating values, the variation occurred in the tristimulus values or the chromaticity coordinates as the color phase indicating values when the light intensity indicating values of the respective wavelength bands R, G, and B are slightly varied.

a. Then, with use of the determined coefficient, the control circuit (Mc) determines variation that is to slightly vary the light emitting intensity indicating values of the respective wavelength bands R, G, and B. Based on the variation, the control circuit (Mc) sets output power of the drive circuits (P1a, P1b, . . . , P2a, P2b, . . . ) through the respective drive circuit control signals (J1a, J1b, . . . , J2a, J2b, . . . ). As a result, the control circuit (Mc) performs the feedback control so that the tristimulus values X, Y, Z or the chromaticity coordinates x and y, and the brightness of light Y are maintained at the respective target values.

According to the electric power and light intensity proportion rule, it is considerable that the light emitting intensity indicating values of the respective wavelength bands R, G, and B are respectively proportional to the total output power Pr of the drive circuits driving the light emitting elements of the R wavelength band, the total output power of the drive circuits driving the light emitting elements of the G wavelength band, and the total output power Pb of the drive circuits driving the light emitting elements of the B wavelength band, independently, out of the drive circuits (P1a, P1b, . . . , P2a, P2b, . . . ). For example, in the case where the light emitting intensity indicating values of the respective wavelength bands R, G, and B are all increased by 1%, when the total output power are 200 W, 300 W, and 100 W, respectively, the light emitting intensity indicating values are increased to 202 W, 303 W, and 101 W, respectively.

The guideline to achieve the improved feedback control is quantitatively described below.

First, a method of calculating the light emitting intensity indicating values and the deviation from normal wavelength that is the wavelength deviation indicating values based on the first light intensity measurement data (Sh1R, Sh1G, Sh1B) and the second light intensity measurement data (Sh2R, Sh2G, Sh2B) is described. The first light intensity measurement data (Sh1R, Sh1G, Sh1B) and the second light intensity measurement data (Sh2R, Sh2G, Sh2B) are obtained by measuring luminous flux to be measured with use of the first light intensity measurement means (A1R, A1G, A1B) and the second light intensity measurement means (A2R, A2G, A2B). The luminous flux to be measured is represented by spectrum $S(\lambda)$ having a wavelength $\lambda$ as a parameter.

When the first light intensity measurement means (A1R, A1G, A1B) include respective spectral sensitivity characteristics $rm(\lambda)$, $gm(\lambda)$, and $bm(\lambda)$ in the respective wavelength bands R, G, and B, light intensity measurement data values Rm, Gm, and Bm in the respective wavelength bands R, G, and B included in the first light intensity measurement data (Sh1R, Sh1G, Sh1B) are represented by the following expressions (Expression 3).

$$Rm = \int S(\lambda) \cdot rm(\lambda) \cdot d\lambda$$

$$Gm = \int S(\lambda) \cdot gm(\lambda) \cdot d\lambda$$

$$Bm = \int S(\lambda) \cdot bm(\lambda) \cdot d\lambda \quad \text{Expression 3}$$

Likewise, when the second light intensity measurement means (A2R, A2G, A2B) include respective spectral sensitivity characteristics $rn(\lambda)$, $gn(\lambda)$, and $bn(\lambda)$ in the respective wavelength bands R, G, and B, light intensity measurement data values Rn, Gn, and Bn in the respective wavelength bands R, G, and B included in the second light intensity measurement data (Sh2R, Sh2G, Sh2B) are represented by the following expressions (expression 4).

$$Rn = \int S(\lambda) \cdot rn(\lambda) \cdot d\lambda$$

$$Gn = \int S(\lambda) \cdot gn(\lambda) \cdot d\lambda$$

$$Bn = \int S(\lambda) \cdot bn(\lambda) \cdot d\lambda \quad \text{Expression 4}$$

These integration regions cover the respective wavelength bands in which spectrum of at least the luminous flux to be measured $S(\lambda)$ exists.

Here, when the luminous flux to be measured $S(\lambda)$ is approximated to be formed of three primary colors R, G, and B, the luminous flux to be measured $S(\lambda)$ is represented by the following expression (expression 5) with use of the delta function $\delta(\lambda)$.

$$S(\lambda) = Sr \cdot \delta(\lambda - \lambda ro - \Delta\lambda r) + \\ Sg \cdot \delta(\lambda - \lambda go - \Delta\lambda g) + Sb \cdot \delta(\lambda - \lambda bo - \Delta\lambda b) \quad \text{Expression 5}$$

Where, the normal wavelength of R, G, and B are denoted by $\lambda ro$, $\lambda go$, and $\lambda bo$, respectively, the deviation from normal wavelength as the wavelength deviation indicating values are denoted by $\Delta\lambda r$, $\Delta\lambda g$, and $\Delta\lambda b$, respectively, and the light emitting intensity indicating values of the wavelength bands R, G, and B are denoted by Sr, Sg, and Sb, respectively. Typically, variation $\Delta f$ in the function $f = f(\lambda)$ when the variable $\lambda$ of the function f is slightly varied by $\Delta\lambda$ is approximated by the following expression (expression 6) with use of the derivative $df/d\lambda$ of the function f.

$$\Delta f = (df/d\lambda) \cdot \Delta\lambda \quad \text{Expression 6}$$

Accordingly, when the variable $\lambda$ is represented by $\lambda = \lambda ro + \Delta\lambda r$ in the case where the variable $\lambda$ is in the vicinity of $\lambda ro$, the spectral sensitivity characteristics are represented by the following expressions (expression 7).

$$rm(\lambda) = rm(\lambda ro + \Delta\lambda r) = rm(\lambda ro) + Ermo \cdot \Delta\lambda r$$

$$rn(\lambda) = rn(\lambda ro + \Delta\lambda r) = rn(\lambda ro) + Erno \cdot \Delta\lambda r \quad \text{Expression 7}$$

Where, Ermo and Erno are values when the variable $\lambda$ in the derivative of $rm(\lambda)$ and $rn(\lambda)$ is $\lambda ro$. The expressions 5 and 7 are applied to the first expression of the expressions 3 and 4, the following expressions (expression 8) are obtained.

$$Rm = Sr \cdot \int \delta(\lambda - \lambda ro - \Delta\lambda r) \cdot rm(\lambda) \cdot d\lambda \quad \text{Expression 8}$$
$$= Sr \cdot rm(\lambda ro + \Delta\lambda r)$$
$$= Sr \cdot [rm(\lambda ro) + Ermo \cdot \Delta\lambda r]$$

-continued $$Rn = Sr \cdot [rn(\lambda ro) + Erno \cdot \Delta\lambda r]$$

where, $$Ermo = drm/d\lambda(\lambda = \lambda ro)$$

$$Erno = drn/d\lambda(\lambda = \lambda ro)$$

These expressions are rewritten in the following manner.

$$Rm = rm(\lambda ro) \cdot Sr + Ermo \cdot Sr \cdot \Delta\lambda r$$

$$Rn = rn(\lambda ro) \cdot Sr + Erno \cdot Sr \cdot \Delta\lambda r$$

As described above, these expressions are simultaneous linear equation with two unknowns relating to Sr and $Sr \cdot \Delta\lambda r$. Therefore, the expressions are solved by elementary calculation to obtain the values Sr and $Sr \cdot \Delta\lambda r$, or the values Sr and $\Delta\lambda r$.

Likewise, when the variable $\lambda$ is represented by $\lambda = \lambda go + \Delta\lambda g$ in the case where the variable $\lambda$ is in the vicinity of $\lambda go$, the following expressions (expression 9) are obtained.

$$Gm = Sg \cdot [gm(\lambda go) + Egmo \cdot \Delta\lambda g]$$

$$Gn = Sg \cdot [gn(\lambda go) + Egno \cdot \Delta\lambda g] \quad \text{Expression 9}$$

where, $$Egmo = dgm/d\lambda(\lambda = \lambda go)$$

$$Egno = dgn/d\lambda(\lambda = \lambda go)$$

Further, when the variable $\lambda$ is represented by $\lambda = \lambda bo + \Delta\lambda b$ in the case where the variable $\lambda$ is in the vicinity of $\lambda bo$, the following expressions (expression 10) are obtained.

$$Bm = Sb \cdot [bm(\lambda bo) + Ebmo \cdot \Delta\lambda b]$$

$$Bn = Sb \cdot [bn(\lambda bo) + Ebno \cdot \Delta\lambda b] \quad \text{Expression 10}$$

where, $$Ebmo = dbm/d\lambda(\lambda = \lambda bo)$$

$$Ebno = dbn/d\lambda(\lambda = \lambda bo)$$

Accordingly, it is possible to obtain the values Sg and $\Delta\lambda g$ and the values Sb and $\Delta\lambda b$ from Determination of the light emitting intensity indicating values Sr, Sg, and Sb and the deviation from normal wavelength that is the wavelength deviation indicating values, based on the light intensity measurement data values Rm, Gm, and Bm that are measured with use of the first light intensity measurement means (A1R, A1G, A1B) and the light intensity measurement data values Rn, Gn, and Bn that are measured with use of the second light intensity measurement means (A2R, A2G, A2B), is summarized as follows.

The local color band spectral sensitivity information relating to the first light intensity measurement means (A1R, A1G, A1B), namely, the values $rm(\lambda ro)$, $gm(\lambda go)$, and $bm(\lambda bo)$ of the spectral sensitivity characteristics $rm(\lambda)$, $gm(\lambda)$, and $bm(\lambda)$ at the normal wavelengths $\lambda ro$, $\lambda go$, and $\lambda bo$ of the respective wavelength bands R, G, and B and the values Ermo, Egmo, and Ebmo of the rate of sensitivity varying against wavelength varying of the spectral sensitivity characteristics are prepared in advance. Further, the local color band spectral sensitivity information relating to the second light intensity measurement means (A2R, A2G, A2B), namely, the values $rn(\lambda ro)$, $gn(\lambda go)$, and $bn(\lambda bo)$ of the spectral sensitivity characteristics rn(λ), gn(λ), and bn(λ) at the normal wavelengths λro, λgo, and λbo of the respective wavelength bands R, G, and B and the values Erno, Egno, and Ebno of the rate of sensitivity varying against wavelength varying of the spectral sensitivity characteristics are prepared in advance.

Then, when the light intensity measurement data values Rm, Gm, Bm by the first light intensity measurement means (A1R, A1G, A1B) and the light intensity measurement data values Rn, Gn, and Bn by the second light intensity measurement means (A2R, A2G, A2B) are obtained, it is possible to easily determine the light emitting intensity indicating values Sr, Sg, and Sb and the deviation from normal wavelength Δλr, Δλg, and Δλb as the wavelength deviation indicating values, from the solution of the expressions 8, 9, and 10.

Out of the drive circuits (P1a, P1b, . . . , P2a, P2b, . . . ) described for the electric power and light intensity proportion rule, the total output power Pr of the drive circuits driving the light emitting elements of the R wavelength band, the total output power Pg of the drive circuits driving the light emitting elements of the G wavelength band, and the total output power Pb of the drive circuits driving the light emitting elements of the B wavelength band are represented by the following expressions (expression 11). The expressions are represented by independent proportionality coefficients kr, kg, and kb and the target values Srp, Sgp, and Sbp of the light emitting intensity indicating values Sr, Sg, and Sb of the respective wavelength bands R, G, and B.

$$Pr = kr \cdot Srp$$

$$Pg = kg \cdot Sgp$$

$$Pb = kb \cdot Sbp$$

Based on the light intensity measurement data values Rm, Gm, and Bm that are measured with use of the first light intensity measurement means (A1R, A1G, A1B) and the light intensity measurement data values Rn, Gn, and Bn that are measured with use of the second light intensity measurement means (A2R, A2G, A2B), it is possible to determine the proportionality coefficients kr, kg, and kb of the above-described expression 11 from the ratio of the light emitting intensity indicating values Sr, Sg, and Sb that are obtained by solving the expressions 8, 9, and 10 and the above-described total output power Pr, Pg, and Pb.

First, it is assumed that safe initial values that are unspecified but appropriately determined are set to the proportionality coefficients kr, kg, and kb. The total output power Pr, Pg, and Pb that may cause safe initial target values Srp, Sgp, Sbp that are appropriately determined with respect to the light emitting intensity indicating values Sr, Sg, and Sb are tentatively determined by the expression 11 based on the unspecified proportionality coefficients kr, kg, and kb.

Based on the light intensity measurement data values Rm, Gm, and Bm and the light intensity measurement data values Rn, Gn, and Bn when the light emitting elements are actually driven with the values of the total output power Pr, Pg, and Pb, the proportionality coefficients kr, kg, and kb may be corrected according to the following expressions (expression 12), with use of the ratio of the light emitting intensity indicating values Sr, Sg, and Sb that are obtained by solving the expressions 8, 9, and 10 and the original target values Srp, Sgp, and Sbp.

$$kr = kr \cdot Srp/Sr$$

$$kg = kg \cdot Sgp/Sg$$

$$kb = kb \cdot Sbp/Sb \qquad \text{Expression 12}$$

Incidentally, the equal sign in each expression of the expression 12 indicates that calculation result on right side is assigned to the variable on left side, which is represented according to notation of calculation instruction of typical programming language such as C.

This correction may be performed every time the slight variation ΔSr, ΔSg, and ΔSb of the light emitting intensity indicating values Sr, Sg, and Sb are determined, the target values Srp, Sgp, and Sbp are updated according to the following expressions (expression 13), power is reset according to the above-described expression 11, and the light intensity measurement data values Rm, Gm, Bm and the light intensity measurement data values Rn, Gn and Bn are measured, in repeat of the feedback control loop as described above.

$$Srp = Sr + \Delta Sr$$

$$Sgp = Sg + \Delta Sg$$

$$Sbp = Sb + \Delta Sb \qquad \text{Expression 13}$$

In this way, as described above, even if the proportionality coefficients kr, kg, and kb are not true proportionality constants but are non-linear coefficients showing saturation tendency, correction is repeatedly performed as a merely ratio defined by the expression 11. Accordingly, the total output power Pr, Pg, and Pb of the drive circuits of R, G, and B and the light emitting intensity indicating values Sr, Sg, and Sb (and the target values Srp, Sgp, and Sbp) are maintained.

Subsequently, there is described a method of determining the variation ΔSr, ΔSg, and ΔSb when the light emitting intensity indicating values Sr, Sg, and Sb are slightly varied, in order to perform the feedback control such that the tristimulus values X, Y, and Z are maintained to the target values thereof or the chromaticity coordinates x and y and the brightness of light Y are maintained to the target values thereof, with use of the light emitting intensity indicating values Sr, Sg, and Sb and the values of the deviation from normal wavelength Δλr, Δλg, and Δλb as the wavelength deviation indicating values that are specifically determined.

As described above, focusing on the chromaticity coordinates x and y as the color phase indicating values correlated with the color of light and focusing on the value Y as the brightness indicating value correlated with the brightness of light, stabilization control thereof has been described.

a. However, the system of x, y, and Y and the system of X, Y, and Z may be converted from each other by the above-described expression 2 and the following expressions (expression 14). Therefore, the tristimulus values are values correlated with the chromaticity coordinates. Consequently, any of the chromaticity coordinates and the tristimulus values may be employed as the color phase indicating values correlated with the color of light.

$$X = Y \cdot x/y$$

$$Z = Y \cdot (1-x-y)/y \qquad \text{Expression 14}$$

Even in the case of values in the other color system (for example, RGB color system), the values may be employed in a similar manner as long as the values are correlated with the chromaticity coordinates. Therefore, a case where the tristimulus values X, Y, and Z are control targets and are controlled to be maintained to the target values Zp, Yp, and Zp is first described.

Also regarding the above-described color matching functions $xe(\lambda)$, $ye(\lambda)$, and $ze(\lambda)$, when the variable $\lambda$ is represented by $\lambda=\lambda ro+\Delta\lambda r$ in the case where the variable $\lambda$ is in the vicinity of $\lambda ro$, the following expressions (expression 15) are obtained by applying the above-described expression 6 in a similar manner.

$xe(\lambda)=xe(\lambda ro+\Delta\lambda r)=xe(\lambda ro)+Fxro\cdot\Delta\lambda r$ $ye(\lambda)=ye(\lambda ro+\Delta\lambda r)=ye(\lambda ro)+Fyro\cdot\Delta\lambda r$ $ze(\lambda)=ze(\lambda ro+\Delta\lambda r)=ze(\lambda ro)+Fzro\cdot\Delta\lambda r$   Expression 15 where $Fxro=dxe/d\lambda(\lambda=\lambda ro)$ $Fyro=dye/d\lambda(\lambda=\lambda ro)$ $Fzro=dze/d\lambda(\lambda=\lambda ro)$ Likewise, when the variable $\lambda$ is represented by $\lambda=\lambda go+\Delta\lambda g$ in the case where the variable $\lambda$ is in the vicinity of $\lambda ro$, the following expressions (expression 16) are obtained.

$xe(\lambda)=xe(\lambda go+\Delta\lambda g)=xe(\lambda go)+Fxgo\cdot\Delta\lambda g$ $ye(\lambda)=ye(\lambda go+\Delta\lambda g)=ye(\lambda go)+Fygo\cdot\Delta\lambda g$ $ze(\lambda)=ze(\lambda go+\Delta\lambda g)=ze(\lambda go)+Fzgo\cdot\Delta\lambda g$   Expression 16 where $Fxgo=dxe/d\lambda(\lambda=\lambda go)$ $Fygo=dye/d\lambda(\lambda=\lambda go)$ $Fzgo=dze/d\lambda(\lambda=\lambda go)$ Further, when the variable $\lambda$ is represented by $\lambda=\lambda bo+\Delta\lambda b$ in the case where the variable $\lambda$ is in the vicinity of $\lambda bo$, the following expressions (expression 17) are obtained.

$xe(\lambda)=xe(\lambda bo+\Delta\lambda b)=xe(\lambda bo)+Fxbo\cdot\Delta\lambda b$ $ye(\lambda)=ye(\lambda bo+\Delta\lambda b)=ye(\lambda bo)+Fybo\cdot\Delta\lambda b$ $ze(\lambda)=ze(\lambda bo+\Delta\lambda b)=ze(\lambda bo)+Fzbo\cdot\Delta\lambda b$ where $Fxbo=dxe/d\lambda(\lambda=\lambda bo)$ $Fybo=dye/d\lambda(\lambda=\lambda bo)$ $Fzbo=dze/d\lambda(\lambda=\lambda bo)$ Similarly to the above description, the above-described expression 5 and the above-described expressions 15, 16, and 17 in which the luminous flux to be measured $S(\lambda)$ is approximated by the delta function are applied to integration of the expression 1 to obtain the following expression (expression 18) relating to the value X of the tristimulus values.

$$X = Sr\cdot[xe(\lambda ro) + Fxro\cdot\Delta\lambda r] +$$
$$Sg\cdot[xe(\lambda go) + Fxgo\cdot\Delta\lambda g] +$$
$$Sb\cdot[xe(\lambda bo) + Fxbo\cdot\Delta\lambda b]$$
$$= Hxr\cdot Sr + Hxg\cdot Sg + Hxb\cdot Sb$$

Expression 18 where $Hxr=xe(\lambda ro)+Fxro\cdot\Delta\lambda r$ $Hxg=xe(\lambda go)+Fxgo\cdot\Delta\lambda g$ $Hxb=xe(\lambda bo)+Fxbo\cdot\Delta\lambda b$ In addition, the following expression (expression 19) relating to the value Y of the tristimulus values is obtained.

$$Y = Sr\cdot[ye(\lambda ro) + Fyro\cdot\Delta\lambda r] +$$
$$Sg\cdot[ye(\lambda go) + Fygo\cdot\Delta\lambda g] +$$
$$Sb\cdot[ye(\lambda bo) + Fybo\cdot\Delta\lambda b]$$
$$= Hyr\cdot Sr + Hyg\cdot Sg + Hyb\cdot Sb$$

Expression 19 where $Hyr=ye(\lambda ro)+Fyro\cdot\Delta\lambda r$ $Hyg=ye(\lambda go)+Fygo\cdot\Delta\lambda g$ $Hyb=ye(\lambda bo)+Fybo\cdot\Delta\lambda b$ Further, the following expression (expression 20) relating to the value Z of the tristimulus values is obtained.

$$Z = Sr\cdot[ze(\lambda ro) + Fzro\cdot\Delta\lambda r] +$$
$$Sg\cdot[ze(\lambda go) + Fzgo\cdot\Delta\lambda g] +$$
$$Sb\cdot[ze(\lambda bo) + Fzbo\cdot\Delta\lambda b]$$
$$= Hzr\cdot Sr + Hzg\cdot Sg + Hzb\cdot Sb$$

Expression 20 where $Hzr=ze(\lambda ro)+Fzro\cdot\Delta\lambda r$ $Hzg=ze(\lambda go)+Fzgo\cdot\Delta\lambda g$ $Hzb=ze(\lambda bo)+Fzbo\cdot\Delta\lambda b$ The variation $\Delta X$, $\Delta Y$, and $\Delta Z$ of the tristimulus values X, Y, and Z when the light emitting intensity indicating values Sr, Sg, and Sb are slightly varied are represented by the following expressions (expression 21) based on the above-described expressions 18, 19, and 20.

$\Delta X=Hxr\cdot\Delta Sr+Hxg\cdot\Delta Sg+Hxb\cdot\Delta Sb$ $\Delta Y=Hyr\cdot\Delta Sr+Hyg\cdot\Delta Sg+Hyb\cdot\Delta Sb$ $\Delta Z=Hzr\cdot\Delta Sr+Hzg\cdot\Delta Sg+Hzb\cdot\Delta Sb$   Expression 21

In this way, the variation of the color phase indicating values when the light emitting intensity indicating values for the respective wavelength bands are slightly varied are represented by the linear operation with use of the variation of the light emitting intensity indicating values, and the coefficients at that time are determined with use of the light emitting intensity indicating values and the wavelength deviation indicating values for the respective wavelength bands.

In the feedback control, when considering that the slight variation ΔSr, ΔSg, and ΔSb are added to the light emitting intensity indicating values Sr, Sg, and Sb in order to allow the current tristimulus values X, Y, and Z to approach the respective target values Xp, Yp, and Zp, the values ΔX, ΔY, and ΔZ are determined by the following expressions (expression 22).

$$\Delta X = D \cdot [Xp - X]$$

$$\Delta Y = D \cdot [Yp - Y]$$

$$\Delta Z = D \cdot [Zp - Z] \qquad \text{Expression 22}$$

Where, a dumping coefficient D is from 0 to 1. As a result, the above-described expression 21 is regarded as an elemental simultaneous linear equation with three unknowns relating to the slight variation ΔSr, ΔSg, and ΔSb. Since all of the coefficients thereof are determined, the expression 21 is easily solved to determine the slight variation ΔSr, ΔSg, and ΔSb of the light emitting intensity indicating values.

a. According to the above-described expression 13, the determined slight variation ΔSr, ΔSg, and ΔSb are added to the original light emitting intensity indicating values Sr, Sg, and Sb to calculate new target values Srp, Sgp, and Sbp of the light emitting intensity indicating values. Then, the total output power Pr, Pg, and Pb of the drive circuits (P1a, P1b, ..., P2a, P2b, ...) are updated through the above-described expression 11.

The way of the feedback control of the variation of the color phase indicating values through the expression 21 represented by the linear operation, with use of the variation of the light emitting intensity indicating values is summarized as follows.

First, the values of the coefficients Hxr, Hxg, Hxb, Hyr, Hyg, Hyb, Hzr, Hzg, and Hzb are prepared in advance according to the expressions 18, 19, and 20. The control circuit (Mc) determines appropriate initial target values Srp, Sgp, and Sbp of the light emitting intensity indicating values Sr, Sg, and Sb for the respective wavelength bands R, G, and B and determines appropriate initial values of the proportionality coefficients kr, kg, and kb. The control circuit (Mc) then sets the total output power Pr, Pg, and Pb of the drive circuits (P1a, P1b, ..., P2a, P2b, ...) with use of the expression 11, starts driving of the light emitting elements (Y1a, Y1b, ..., Y2a, Y2b, ...), and waits during a warm-up period appropriately determined.

The control circuit (Mc) reads the first light intensity measurement data (Sh1R, Sh1G, Sh1B) and the second light intensity measurement data (Sh2R, Sh2G, and Sh2B), namely, the light intensity measurement data values Rm, Gm, and Bm and the light intensity measurement data values Rn, Gn, and Bn, from the first light intensity measurement means (A1R, A1G, A1B) and the second light intensity measurement means (A2R, S2G, S2B). The light intensity measurement data values Rm, Gm, and Bm and the light intensity measurement data values Rn, Gn, and Bn are applied to the above-described expressions 8, 9, and 10. The light emitting intensity indicating values Sr, Sg, and Sb that are obtained by solving the expressions and the original target values Srp, Sgp, and Sbp are applied to the expression 12 to update the proportionality coefficients kr, kg, and kb.

The tristimulus values X, Y, and Z that are calculated through the expressions 18, 19, and 20 based on the obtained light emitting intensity indicating values Sr, Sg, and Sb and the target values Xp, Yp, and Zp thereof are applied to the expression 22. As a result, the left side of the expression 21 is determined Thus, the expression 21 is regarded as the simultaneous linear equation with three unknowns and solved to determine the slight variation ΔSr, ΔSg, and ΔSb of the light emitting intensity indicating values.

The control circuit (Mc) applies, with respect to the current values Sr, Sg, and Sb of the light emitting intensity indicating values, the determined slight variation ΔSr, ΔSg, and ΔSb to the expression 13 to calculate new target values Srp, Sgp, and Sbp of the light intensity indicating values. The control circuit (Mc) then updates the total output power Pr, Pg, and Pb of the drive circuits (P1a, P1b, ..., P2a, P2b, ...) according to the expression 11.

The control circuit (Mc) then returns to the operation of reading the first light intensity measurement data (Sh1R, Sh1G, Sh1B) and the second light intensity measurement data (Sh2R, Sh2G, Sh2B). Subsequently, the above-described sequence is repeated to build the feedback control loop.

Note that the slight variation ΔSr, ΔSg, and ΔSb of the light emitting intensity indicating values are suppressed to small with the decrease of the above-described dumping coefficient, which exhibits an effect of decreasing variation rate of the feedback control to prevent unstable phenomenon such as overrun and oscillation. Incidentally, the dumping coefficient may be preferably determined experimentally to suitable value since excessively small value may cause inconvenience, for example, excess time is necessary to complete correction.

In the case where one of the light emitting intensity indicating values Sr, Sg, and Sb, for example, Sr is determined separately for any reason (for example, in a case of reaching rating), the target values Xp, Yp, and Zp of the tristimulus values are not met. It is necessary to change control system so that the color of light is maintained to a target color while giving up maintaining the brightness of light.

In a case of a method of performing control such that the above-described tristimulus values X, Y, and Z are maintained to the target values Xp, Yp, and Zp, for example, when the brightness of light is reduced such that the light intensity indicating value Sr becomes a predetermined value while maintaining the target color of light, the target values Xp, Yp, and Zp of the tristimulus values are tentatively reduced at the same rate appropriately determined, and the feedback loop is actually performed through trial and error until an appropriate rate such that the light intensity indicating value Sr becomes the predetermined value is found.

In contrast, when the chromaticity coordinates x and y that are the color phase indicating values correlated with the color of light and the value Y that is the brightness indicating value correlated with the brightness of light are target of control, and if the control system of maintaining the values x, y, and Y to the target values xp, yp, and Yp is achieved, for example, it becomes possible to perform the feedback control to maintain only the chromaticity coordinates x and y to the target values while the value Sr is fixed. A case where the control targets are the values x, y, and Y and control is performed such that the values x, y, and Y are maintained to the target values xp, yp, and Yp is described below.

When the above-described expressions 18, 19 and 20 relating to the tristimulus values X, Y, and Z are applied in order to calculate the chromaticity coordinates x and y, the following expression (expression 23) relating to sum of the tristimulus values X, Y, and Z is obtained.

$$T = X + Y + Z \qquad \text{Expression 23}$$
$$= [Hxr + Hyr + Hzr] \cdot Sr +$$
$$[Hxg + Hyg + Hzg] \cdot Sg +$$
$$[Hxb + Hyb + Hzb] \cdot Sb$$
$$= Ir \cdot Sr + Ig \cdot Sg + Ib \cdot Sb$$

where $$Ir = Hxr + Hyr + Hzr$$
$$Ig = Hxg + Hyg + Hzg$$
$$Ib = Hxb + Hyb + Hzb$$

Accordingly, the chromaticity coordinates x and y in the above-described expression 2 relating to the luminous flux to be measured $S(\lambda)$ are calculated by the following expressions (expression 24) using the above-described expressions 18, 19, and 20.

$$x = X/T$$
$$y = Y/T \qquad \text{Expression 24}$$

Typically, variation in the function f=f(u, v, w) when variables u, v, and w of the function f are slightly varied is approximated to the following expression (expression 25) with use of partial derivatives $\delta f/\delta u$, $\delta f/\delta v$, and $\delta f/\delta w$ of the function f.

$$\Delta f = (\delta f/\delta u) \cdot \Delta u + (\delta f/\delta v) \cdot \Delta v + (\delta f/\delta w) \cdot \Delta w \qquad \text{Expression 25}$$

When the chromaticity coordinates x and y and the brightness of light Y are regarded as functions including the light emitting intensity indicating values Sr, Sg, and Sb as variables, the values of the partial derivatives are specifically determined as the following expressions (expression 26).

$$Jxr = \delta x/\delta Sr = [\delta X/\delta Sr \cdot T - X \cdot \delta T/\delta Sr]/[T \cdot T] \qquad \text{Expression 26}$$
$$= [Hxr \cdot T - Ir \cdot X]/[T \cdot T]$$
$$= [Hxr - Ir \cdot x]/T$$
$$Jxg = \delta x/\delta Sg = [Hxg - Ig \cdot x]/T$$
$$Jxb = \delta x/\delta Sb = [Hxb - Ib \cdot x]/T$$
$$Jyr = \delta y/\delta Sr = [Hyr - Ir \cdot y]/T$$
$$Jyg = \delta y/\delta Sg = [Hyg - Ig \cdot y]/T$$
$$Jyb = \delta y/\delta Sb = [Hyb - Ib \cdot y]/T$$

Accordingly, the variation of the chromaticity coordinates x and y and the brightness of light Y when the light intensity indicating values Sr, Sg, and Sb are slightly varied are represented by the following expressions (expression 27).

$$\Delta x = Jxr \cdot \Delta Sr + Jxg \cdot \Delta Sg + Jxb \cdot \Delta Sb$$
$$\Delta y = Jyr \cdot \Delta Sr + Jyg \cdot \Delta Sg + Jyb \cdot \Delta Sb$$
$$\Delta Y = Hyr \cdot \Delta Sr + Hyg \cdot \Delta Sg + Hyb \cdot \Delta Sb \qquad \text{Expression 27}$$

In this way, the variation of the color phase indicating values when the light emitting intensity indicating values are slightly varied for the respective wavelength bands are represented by linear operation with use of the variation of the light emitting intensity indicating values. In addition, the coefficients at that time are determined with use of the light emitting intensity indicating values and the wavelength deviation indicating values for the respective wavelength bands. Incidentally, the third expression (relating to the variation $\Delta Y$) in the expression 27 is based on the following relationship obtained from the expression 19.

$$\delta Y/\delta Sr = Hyr$$
$$\delta Y/\delta Sg = Hyg$$
$$\delta Y/\delta Sb = Hyb$$

As described regarding the expression 22, it is considered that the light emitting intensity indicating values Sr, Sg, and Sb are slightly varied in order to allow the current values x, y, and Y to approach the target values xp, yp, and Yp in the feedback control. When the dumping coefficient D is from 0 to 1, the variation $\Delta x$, $\Delta y$, and $\Delta Y$ are determined by the following expressions (expression 28).

$$\Delta x = D \cdot [xp - x]$$
$$\Delta y = D \cdot [yp - y]$$
$$\Delta Y = D \cdot [Yp - Y] \qquad \text{Expression 28}$$

As a result, the above-described expression 27 is regarded as an essential simultaneous linear equation with three unknowns relating to the slight variation $\Delta Sr$, $\Delta Sg$, and $\Delta Sb$ of the light emitting intensity indicating values. Since all of the coefficients are determined, the equation is easily solved to determine the values of the slight variation $\Delta Sr$, $\Delta Sg$, and $\Delta Sb$ of the light emitting intensity indicating values.

The way of the feedback control of the variation of the color phase indicating values through the expression 27 represented by the linear operation, with use of the variation of the light emitting intensity indicating values is summarized as follows. The local color band color matching function information relating to the color matching functions $xe(\lambda)$, $ye(\lambda)$, and $ze(\lambda)$, namely, the values of the function values $xe(\lambda ro)$, $ye(\lambda ro)$, $ze(\lambda ro)$, $xe(\lambda go)$, $ye(\lambda go)$, $ze(\lambda go)$, $xe(\lambda bo)$, $ye(\lambda bo)$, and $ze(\lambda bo)$ at the normal wavelengths $\lambda ro$, $\lambda go$, and $\lambda bo$ of the respective wavelength bands R, G, and B, and the values of the rate of function output varying against wavelength varying Fxro, Fyro, Fzro, Fxgo, Fygo, Fzgo, Fxbo, Fybo, and Fzbo are prepared in advance.

Regarding the light emitting intensity indicating values Sr, Sg, and Sb for the respective wavelength bands R, G, and B, the control circuit (Mc) determines appropriate initial target values Srp, Sgp, and Sbp, and determines appropriate initial values of the proportionality coefficients kr, kg, and kb. The control circuit (Mc) then sets the total output power Pr, Pg, and Pb of the drive circuits (P1a, P1b, . . . , P2a, P2b, . . . ) with use of the expression 11, starts driving of the light emitting elements (Y1a, Y1b, . . . , P2a, P2b, . . . ), and waits during a warm-up period appropriately determined.

The control circuit (Mc) reads the first light intensity measurement data (Sh1R, Sh1G, Sh1B) and the second light intensity measurement data (Sh2R, Sh2G, Sh2B), namely, the light intensity measurement data values Rm, Gm and Bm and the light intensity measurement data values Rn, Gn, and Bn from the first light intensity measurement means (A1R, A1G, A1B) and the second light intensity measurement means (A2R, A2G, A2B).

The light intensity measurement data values Rm, Gm and Bm and the light intensity measurement data values Rn, Gn, and Bn are applied to the above-described expressions 8, 9, and 10. The light emitting intensity indicating values Sr, Sg, and Sb that are obtained by solving the expressions and the original target values Srp, Sgp, and Sbp are applied to the expression 12 to update the proportionality coefficients kr, kg, and kb.

Then, the light emitting intensity indicating values Sr, Sg, and Sb that are obtained by solving the expressions 8, 9, and 10 and the values of the deviation from normal wavelength $\Delta\lambda r$, $\Delta\lambda g$, and $\Delta\lambda b$ as the wavelength deviation indicating values are applied to the above-described expressions 18, 19, and 23. As a result, the tristimulus values X and Y and the value T are obtained through auxiliary coefficients Hxr, Hxg, Hxb, Hyr, Hyg, Hyb, Hzr, Hzg, Hzb, Ir, Ig, and Ib. Then, it is possible to obtain the values of the chromaticity coordinates x and y by applying the obtained values to the above-described expression 24.

When the determined values x, y, and Y and the target values xp, yp, and Yp are applied to the above-described expression 28, the left side of the above-described expression 27 is determined. In addition, the coefficients on the right side of the expression 27 are determined by the coefficients Jxr, Jxg, Jxb, Jyr, Jyg, and Jyb in the expression 26. Therefore, the expression 27 is regarded as the simultaneous linear equation with three unknowns and is solved to determine the values of the slight variation $\Delta Sr$, $\Delta Sg$, and $\Delta Sb$ of the light emitting intensity indicating values.

The control circuit (Mc) applies, with respect to the current values Sr, Sg, and Sb of the light emitting intensity indicating values, the determined slight variation $\Delta Sr$, $\Delta Sg$, and $\Delta Sb$ to the expression 13 to calculate new target values Srp, Sgp, and Sbp of the light emitting intensity indicating values. The control circuit (Mc) then updates the total output power Pr, Pg, and Pb of the drive circuits (P1a, P1b, . . . , P2a, P2b, . . . ) according to the expression 11. The control circuit (Mc) then returns to the operation of reading the first light intensity measurement data (Sh1R, Sh1G, Sh1B) and the second light intensity measurement data (Sh2R, Sh2G, Sh2B). Subsequently, the above-described sequence is repeated to build the feedback control loop.

In the case where one of the slight variation $\Delta Sr$, $\Delta Sg$, and $\Delta Sb$ of the light emitting intensity indicating values Sr, Sg, and Sb, for example, the slight variation $\Delta Sr$ is determined separately for any reason (for example, in a case of reaching rating), the slight variation $\Delta Sr$ is regarded not as the unknown value, but as a constant in the expression 27 to apply the following expressions (expression 29) that are obtained by modifying the expression 27.

$$\Delta x - Jxr \cdot \Delta Sr = Jxg \cdot \Delta Sg + Jxb \cdot \Delta Sb$$

$$\Delta y - Jyr \cdot \Delta Sr = Jyg \cdot \Delta Sg + Jyb \cdot \Delta Sb \qquad \text{Expression 29}$$

The expression 29 is an elemental simultaneous linear equation with two unknowns, which is easily solved. Therefore, it is possible to obtain the slight variation $\Delta Sg$ and $\Delta Sb$. In such a case, although the brightness of light Y is not maintained to the target value, the feedback control to maintain the chromaticity coordinates x and y to the target values is performable.

Validity of approximation of the luminous flux to be measured $S(\lambda)$ by the delta function that is described in the expression 5 is additionally described. When the plurality of light emitting elements is collected, fluctuation occurs in emission wavelength even if the colors of the light emitting elements are the same. Thus, the spectrum $S(\lambda)$ of light that is obtained by integrating light emitted from the light emitting elements does not actually become the delta function as the expression 5. Even if fluctuation occurs in emission wavelength, however, the above-described discussion is established by integrating all of the light emitting elements included in the same wavelength band to replace the light emitting elements with a virtual single-color light source that has a wavelength equal to an average value of the wavelengths of the integrated light emitting elements.

Incidentally, when all of the light emitting elements included in the same wavelength band are integrated, expansion of the spectrum width caused by the fluctuation of the wavelength exits. As a result, the chromaticity coordinates slightly move toward white. However, the movement is small, and the calculation of the chromaticity coordinates and the like in the light source unit is not to determine accurate absolute values but to correct, through the feedback control, impaired white balance that is caused by change of the emission wavelength due to temperature increase of the light emitting elements and the like. Since the expansion of the spectrum width caused by the fluctuation of wavelength exists before such variation of the emission wavelength occurs. Accordingly, practical disadvantage does not occur to achieve the object of the calculation.

Further, the target values xp, yp, and Yp of the feedback control are additionally described. As described above, various kinds of approximation calculation are performed while assuming that the object of the calculation of the chromaticity coordinates and the like in the light source unit is not determination of accurate absolute values as described above. Therefore, if the target values xp, yp, and YP are provided as a numerical values, it is unknown whether the state achieved by the feedback control becomes desirable state. Such usage is not suitable. For example, in a case where the light source unit is applied to a projector, the light source unit is actually mounted on an actual unit of the projector, and an image to be white color is projected on a screen while the feedback control is stopped. The light intensity of each of R, G, and B of the light source unit is manually adjusted so as to obtain desired white color. The values x, y, and Y measured by the light source unit itself at the end of the adjustment may be preferably stored as the target values xp, yp, and Yp. The actual values of the stored target values do not matter. The state where the desired white color is obtainable is achieved by performing the feedback control after that. The above statement relating to the target values xp, yp, and Yp applies to the target values Xp, Yp, and Zp of the tristimulus values.

The determination of the deviation from normal wavelength $\Delta\lambda r$, $\Delta\lambda g$, and $\Delta\lambda b$ by solving the above-described expressions 8, 9, and 10 and calculation of the tristimulus values X, Y, and Z and the chromaticity coordinates x and y at that time with use of the deviation from normal wavelength have been described. In addition, there has been presented the calculation method using the determined values of the deviation from normal wavelength $\Delta\lambda r$, $\Delta\lambda g$, and $\Delta\lambda b$ in determination of the coefficients Hxr, Hxg, Hxb, Hyr, Hyg, Hyb, Hzr, Hzg, Hzb, Jxr, Jxg, Jxb, Jyr, Jyg, and Jyb of the expressions 21 and 27 that are linear equations for the feedback control. Regarding these coefficients, however, it is possible to determine the values by approximating all of the deviation from normal wavelength $\Delta\lambda r$, $\Delta\lambda g$, and $\Delta\lambda b$ to zero.

The reason is as follows. Although accuracy of the calculation is deteriorated by this approximation, influence of the deterioration appears as slight deviation of the directions of the respective vectors $\Delta X$, $\Delta Y$, and $\Delta Z$ and $\Delta x$, $\Delta y$, and $\Delta Y$, as compared with those in the case where approximation is not performed. The calculation is repeatedly performed in the feedback control loop. Therefore, even if deviation occurs, the tristimulus values X, Y, and Z and the chromaticity coordinates x and y approach asymptotically to the target values Xp, Yp, Zp, xp, and yp, respectively. When such approximation is performed, asymptotic speed to the targets may be deteriorated, but calculation of the coefficients is simplified advantageously. The calculation method in the case where the approximation is performed in such a manner is described below.

When the light emitting intensity indicating values under approximation in which the deviation from normal wavelength is approximated to zero are denoted by Sr, Sg, and Sb that are the same symbols in the case where approximation is not performed, the tristimulus values X, Y, and Z corresponding to the above-described expressions 18, 19, and 20 are represented by the following expressions (expression 30).

$$X = Hxro \cdot Sr + Hxgo \cdot Sg + Hxbo \cdot Sb$$

$$Y = Hyro \cdot Sr + Hygo \cdot Sg + Hybo \cdot Sb$$

$$Z = Hzro \cdot Sr + Hzgo \cdot Sg + Hzbo \cdot Sb \qquad \text{Expression 30}$$

where $$Hxro = xe(\lambda ro)$$

$$Hxgo = xe(\lambda go)$$

$$Hxbo = xe(\lambda bo)$$

$$Hyro = ye(\lambda ro)$$

$$Hygo = ye(\lambda go)$$

$$Hybo = ye(\lambda bo)$$

$$Hzro = ze(\lambda ro)$$

$$Hzgo = ze(\lambda go)$$

$$Hzbo = ze(\lambda bo)$$

As a result, the following expressions (expression 31) are obtained as the equations to be solved in the feedback control loop in place of the above-described expression 21.

$$\Delta X = Hxro \cdot \Delta Sr + Hxgo \cdot \Delta Sg + Hxbo \cdot \Delta Sb$$

$$\Delta Y = Hyro \cdot \Delta Sr + Hygo \cdot \Delta Sg + Hybo \cdot \Delta Sb$$

$$\Delta Z = Hzro \cdot \Delta Sr + Hzgo \cdot \Delta Sg + Hzbo \cdot \Delta Sb \qquad \text{Expression 31}$$

In this way, the variation of the color phase indicating values when the light emitting intensity indicating values for the respective wavelength bands are slightly varied are represented by the linear operation with use of the variation of the light emitting intensity indicating values, and the coefficients at that time are determined.

The values ΔX, ΔY, and ΔZ on the left side of the expressions may be calculated with use of the above-described expression 22 based on the target values Xp, Yp, and Zp of the tristimulus values and the values of the tristimulus values X, Y, and Z at that time. The values of the tristimulus values X, Y, and Z may be determined by calculating the expressions 18, 19, and 20 after the light intensity measurement data values Rm, Gm, and Bm by the first light intensity measurement means (A1R, A1G, and A1B) and the light intensity measurement data values Rn, Gn, and Bn by the second light intensity measurement means (A2R, A2G, A2B) are acquired, and the expressions 8, 9, and 10 are solved to determine the light emitting intensity indicating values Sr, Sg, and Sb and the deviation from normal wavelength Δλr, Δλg, and Δλb as the wavelength deviation indicating values.

Likewise, Ir, Ig, and Ib of the expression 23 relating to the chromaticity coordinates x and y under the approximation in which the deviation from normal wavelength Δλr, Δλg, and Δλb are each approximated to zero and expressions corresponding to the expression 26 are represented by the following expressions (expressions 32 and 33).

$$Iro = Hxro + Hyro + Hzro$$

$$Igo = Hxgo + Hygo + Hzgo$$

$$Ibo = Hxbo + Hybo + Hzbo \qquad \text{Expression 32}$$

$$Jxro = [Hxro - Iro \cdot x]/T$$

$$Jxgo = [Hxgo - Igo \cdot x]/T$$

$$Jxbo = [Hxbo - Ibo \cdot x]/T$$

$$Jyro = [Hyro - Iro \cdot y]/T$$

$$Jygo = [Hygo - Igo \cdot y]/T$$

$$Jybo = [Hybo - Ibo \cdot y]/T \qquad \text{Expression 33}$$

Incidentally, as described above, The values x, y, and T may be calculated by applying the values of the tristimulus values X, Y, and Z that are calculated by the expressions 18, 19, and 20 to the uppermost expression of the expression 23, namely, the following expression and to the expression 24, after the light intensity measurement data values Rm, Gm, and Bm by the first light intensity measurement means (A1R, A1G, and A1B) and the light intensity measurement data values Rn, Gn, and Bn by the second light intensity measurement means (A2R, A2G, A2B) are acquired and the expressions 8, 9, and 10 are solved to determine the light emitting intensity indicating values Sr, Sg, and Sb and the deviation from normal wavelength Δλr, Δλg, and Δλb as the wavelength deviation indicating values.

$$T = X + Y + Z \text{ (redescribed)}$$

Then, the following expressions (expression 34) that are expressions to be solved in the feedback control loop in place of the expression 27 are obtained.

$$\Delta x = Jxro \cdot \Delta Sr + Jxgo \cdot \Delta Sg + Jxbo \cdot \Delta Sb$$

$$\Delta y = Jyro \cdot \Delta Sr + Jygo \cdot \Delta Sg + Jybo \cdot \Delta Sb$$

$$\Delta Y = Hyro \cdot \Delta Sr + Hygo \cdot \Delta Sg + Hybo \cdot \Delta Sb \qquad \text{Expression 34}$$

In this way, the variation of the color phase indicating values when the light emitting intensity indicating values for the respective wavelength bands are slightly varied are represented by the linear operation with use of the variation of the light emitting intensity indicating values, and the coefficients at that time are determined.

The values Δx, Δy, and ΔY on the left side of the expressions may be calculated by the expression 28, based on the target values xp, yp, and Yp of the chromaticity coordinates x and y and the brightness indicating value Y and the values x, y, and Y at that time. Also in the case where approximation in which the deviation from normal wavelength is approximated to zero is performed, one of the light emitting intensity indicating values Sr, Sg, and Sb is eliminated from the expression 34, and the feedback control to maintain only the chromaticity coordinates x and y to the target values may be performed, by using the same method described with reference to the expression 29.

Also in the case where the approximation in which the deviation from normal wavelength is approximated to zero is performed, the above-described expressions 11, 12, and 13 are effectively used for determination of each of the total output power Pr of the drive circuits driving the light emitting elements of the R wavelength band, the total output power Pg of the drive circuits driving the light emitting elements of the G wavelength band, and the total output power Pb of the drive circuits driving the light emitting elements of the B wavelength band, out of the above-described drive circuits (P1a, P2b, . . . , P2a, P2b, . . . ). In other words, as described above, the control circuit (Mc) reads the first light intensity measurement data (Sh1R, Sh1G, Sh1B) and the second light intensity measurement data (Sh2R, Sh2G, Sh2B), namely, the light intensity measurement data values Rm, Gm, and Bm and the light intensity measurement data values Rn, Gn, and Bn, from the first light intensity measurement means (A1R, A1G, A1B) and the second light intensity measurement means (A2R, A2G, A2B).

The light intensity measurement data values Rm, Gm, and Bm and the light intensity measurement data values Rn, Gn, and Bn are applied to the above-described expressions 8, 9, and 10. The light emitting intensity indicating values Sr, Sg, and Sb that are obtained by solving the expressions and the original target values Srp, Sgp, and Sbp are applied to the expression 12 to update the proportionality coefficients kr, kg, and kb. After the variation ΔSr, ΔSg, and ΔSb are obtained by solving the expression 31 or 34, the control circuit (Mc) applies, with respect to the current values Sr, Sg, and Sb of the light emitting intensity indicating values, the obtained variation ΔSr, ΔSg, and ΔSb to the expression 13 to calculate new target values Srp, Sgp, and Sbp of the light emitting intensity indicating values. The control circuit (Mc) then updates the total output power Pr, Pg, and Pb of the drive circuits (P1a, P1b, . . . , P2a, P2b, . . . ) according to the expression 11. The control circuit (Mc) then returns to the operation of reading the first light intensity measurement data (Sh1R, Sh1G, Sh1B) and the second light intensity measurement data (Sh2R, Sh2G, Sh2B). Subsequently, the above-described sequence is repeated to build the feedback control loop.

The values of the tristimulus values X, Y, and Z on the left side of the expressions in the expression 30 are calculated by the expressions 18, 19, and 20 after the light intensity measurement data values Rm, Gm, and Bm by the first light intensity measurement means (A1R, A1G, and A1B) and the light intensity measurement data values Rn, Gn, and Bn by the second light intensity measurement means (A2R, A2G, A2B) are acquired, and the expressions 8, 9, and 10 are solved to determine the light emitting intensity indicating values Sr, Sg, and Sb and the deviation from normal wavelength Δλr, Δλg, and Δλb as the wavelength deviation indicating values. The values obtained by solving the expression 30 are used as the light emitting intensity indicating values Sr, Sg, and Sb to be applied to the expressions 12 and 13.

The example in which the first light intensity measurement means (A1R, A1G, A1R) are configured separately from the second light intensity measurement means (A2R, A2G, A2B) has been described above. However, the first light intensity measurement means (A1R, A1G, A1B) and the second light intensity measurement means (A2R, A2G, A2B) are achieved by alternately applying characteristic variation to the same light intensity measurement means in a time-divisional manner. In this case, the first light intensity measurement means (A1R, A1G, A1B) shares an optical sensor with the second light intensity measurement means (A2R, A2G, A2B). In the case of functioning as the second light intensity measurement means (A2R, A2G, A2R), a light characteristic filter (Et1, Et2) different from that in the case of functioning as the first light intensity measurement means (A1R, A1G, A1B) may be provided.

Figure 5:
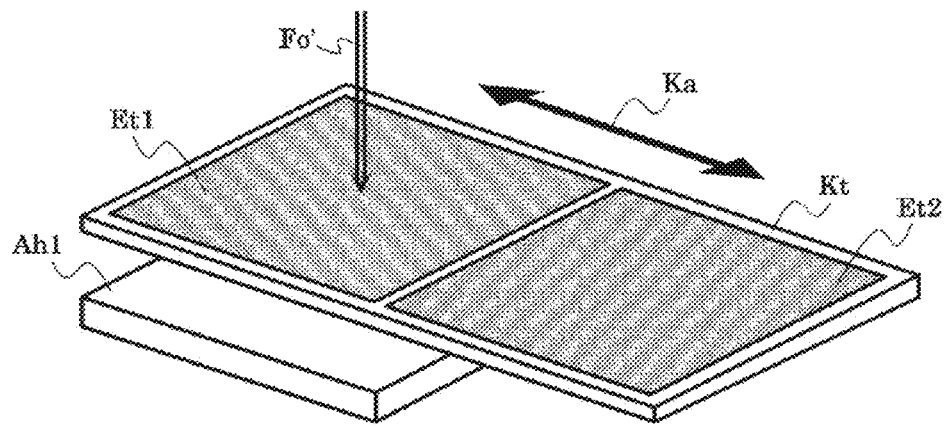
FIG. 5 is a pattern diagram illustrating a part of the light source unit according to the embodiment of the invention in a simplified manner.

For example, as illustrated in FIG. 5 that is a schematic diagram illustrating a part of the light source unit according to the embodiment of the invention in a simplified manner, a filter frame (Kt) attached with the light characteristic filters (Et1, Et2) is disposed on a front surface of the optical sensor circuit section (Ah1) that is similar to that described in FIG. 3, and the filter frame (Kt) is moved along an arrow (Ka). When the light characteristic filter (Et1) is located on the front surface of the optical sensor circuit section (Ah1), the optical sensor circuit section (Ah1) and the light characteristic filter (Et1) may function as the first light intensity measurement means (A1R, A1G, A1B). When the light characteristic filter (Et2) is located on the front surface of the optical sensor circuit section (Ah1), the optical sensor circuit section (Ah1) and the light characteristic filter (Et2) may function as the second light intensity measurement means (A2R, A2G, A2B). The configuration in which the light characteristic filters (Et1, Et2) are reciprocated is illustrated in FIG. 5. Alternatively, a circular frame provided with the light characteristic filters (Et1, Et2) may be disposed and rotated.

In the light source unit according to the embodiment of the invention, the light emitting intensity indicating values and the wavelength deviation indicating values are calculated from the difference in photodetection signals to light with the same wavelength, based on the difference of the spectral sensitivity characteristics of the light characteristic filters (Et1, Et2) respectively included in the first light intensity measurement means (A1R, A1G, A1B) and the second light intensity measurement means (A2R, A2G, A2B). Therefore, if sensitivity variation that is different depending on temporal change, temperature drift, and the like, occurs in the optical sensor element in each of the first light intensity measurement means (A1R, A1G, A1B) and the second light intensity measurement means (A2R, A2G, A2B), error may occur in the calculation of the light emitting intensity indicating values and the wavelength variation indicating values. When the optical sensor is shared in such a way, it is possible to obtain advantage that the calculation is not influenced by the variation as long as interval of light intensity measurement by switch between the first light intensity measurement means (A1R, A1G, A1B) and the second light intensity measurement means (A2R, A2G, A2B) is sufficiently shorter than the variation time scale.

As the optical sensor, an image pickup element may be used in addition to an optical sensor detecting light intensity. On or both of the optical sensor included in the first light intensity measurement means (A1R, A1G, A1B) and the optical sensor included in the second light intensity measurement means (A2R, A2G, A2B) may be the image pickup element. In particular, in the image pickup element for color photographing, color filters of R, G, and B are provided in each pixel. Thus, the color band filters (Et1R, Et1G, Et1B) becomes unnecessary advantageously.

The configuration in which light is transmitted with use of the optical fiber has been described with reference to FIG. 2. Since the optical fiber is formed of fragile glass such as quartz, the optical fiber disadvantageously has a risk of breakage. If the optical fiber is broken, optical power is leaked from the broken part and leaked optical power is absorbed by a covering material that is provided to mechanically protect the optical fiber, which may cause burning out of the covering material. Therefore, safety measures that detect breakage of the optical fiber and turn off the light emitting elements are necessary. When large power is transmitted as a whole, the optical power is divided and transmitted by a plurality of optical fibers, which is advantageous in terms of configuration of the optical system and safety even if the light has the same color. In such a case, desirably, the light intensity per one optical fiber may be monitored in addition to the integral light intensity from all of the optical fibers, and breakage of the optical fiber may be detected individually.

As described above, in the case where the exit ends (Eo1, Eo2, . . . ) of the respective optical fibers (Ef1, Ef2, . . . ) are bundled such that the exit ends are aligned so as to be positioned on the same plane, by projecting an image on a plane at which the exits ends (Eo1, Eo2, . . . ) are positioned, to the image pickup element with use of a lens or the like, it is possible to identify each optical fiber and monitor the light intensity, and it is thus possible to detect breakage of the optical fiber individually. In addition, the function same as the function of the optical sensor circuit section (Ah1) is fulfilled by totalizing the light intensity of the images projected on the image pickup element, of all of the optical fibers that transmit the same color light, in each of the colors R, G, and B.

Figure 6:
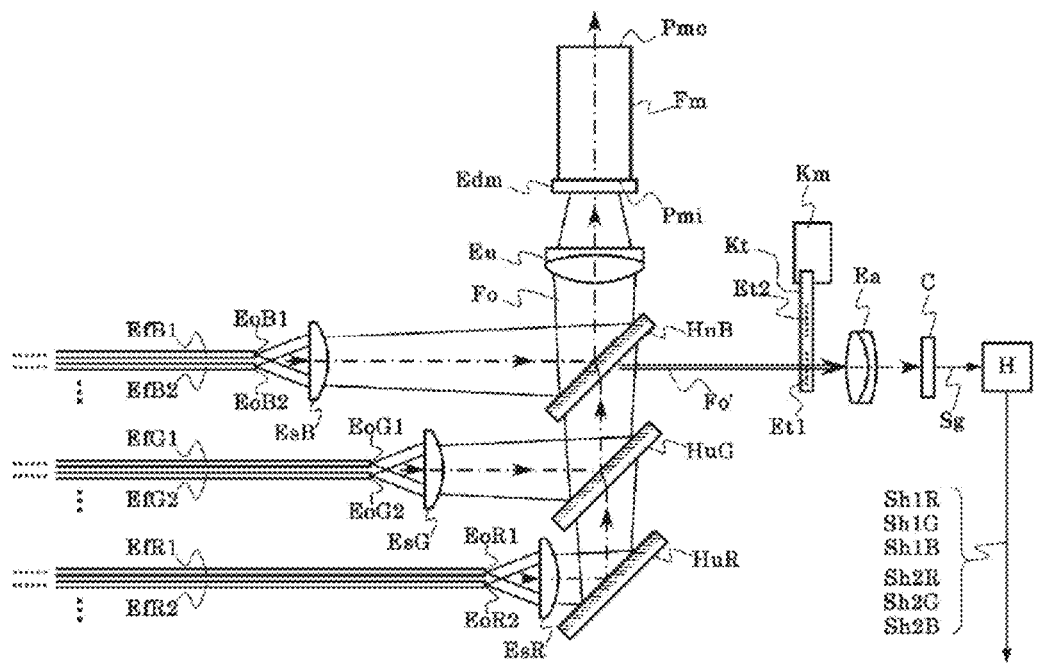
FIG. 6 is a diagram illustrating an application example of the light source unit according to the embodiment of the invention in a simplified manner.

Next, with reference to FIG. 6 that is a diagram illustrating an application example of the light source unit according to the embodiment of the invention in a simplified manner, more specific configuration of the optical fibers and subsequent to the exit ends of the optical fibers in a projector using the light source unit according to the embodiment of the invention is described. The light source unit has a configuration in which a plurality of optical fibers for each of the three primary colors R, G, and B, namely, optical fibers for R light source (EfR1, EfR2, . . . ), optical fibers for G light source (EfG1, EfG2, . . . ), and optical fibers for B light source (EfB1, EfB2, . . . ) are configured as a fiber bundle whose respective exit ends are aligned and bundled, and luminous fluxes in which the light from the exit ends of the three fiber bundles are converted into infinite images by respective collimator lenses are color-synthesized with use of a mirror (HuR) and dichroic mirrors (HuG, HuB) to generate the output luminous flux (Fo) of the light source unit.

Figure 7:
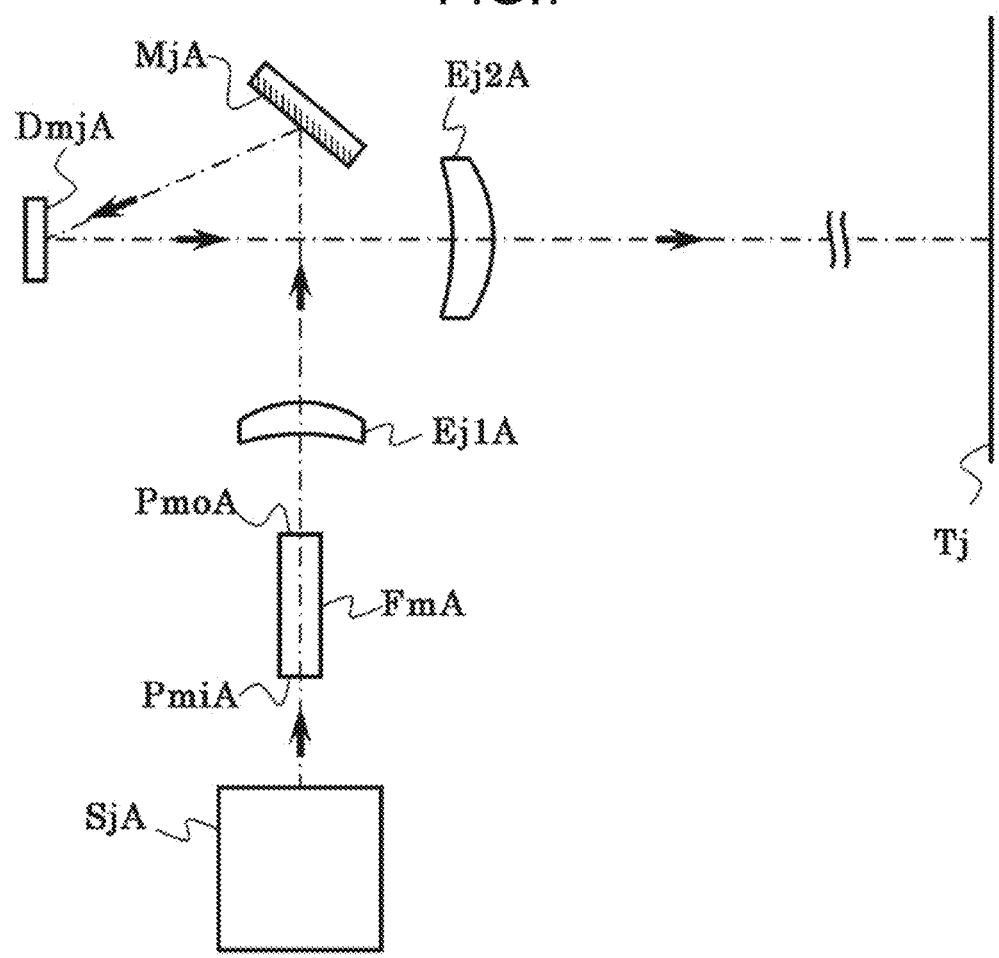
FIG. 7 is a diagram for explaining a part of one kind of existing projectors.
Figure 8:
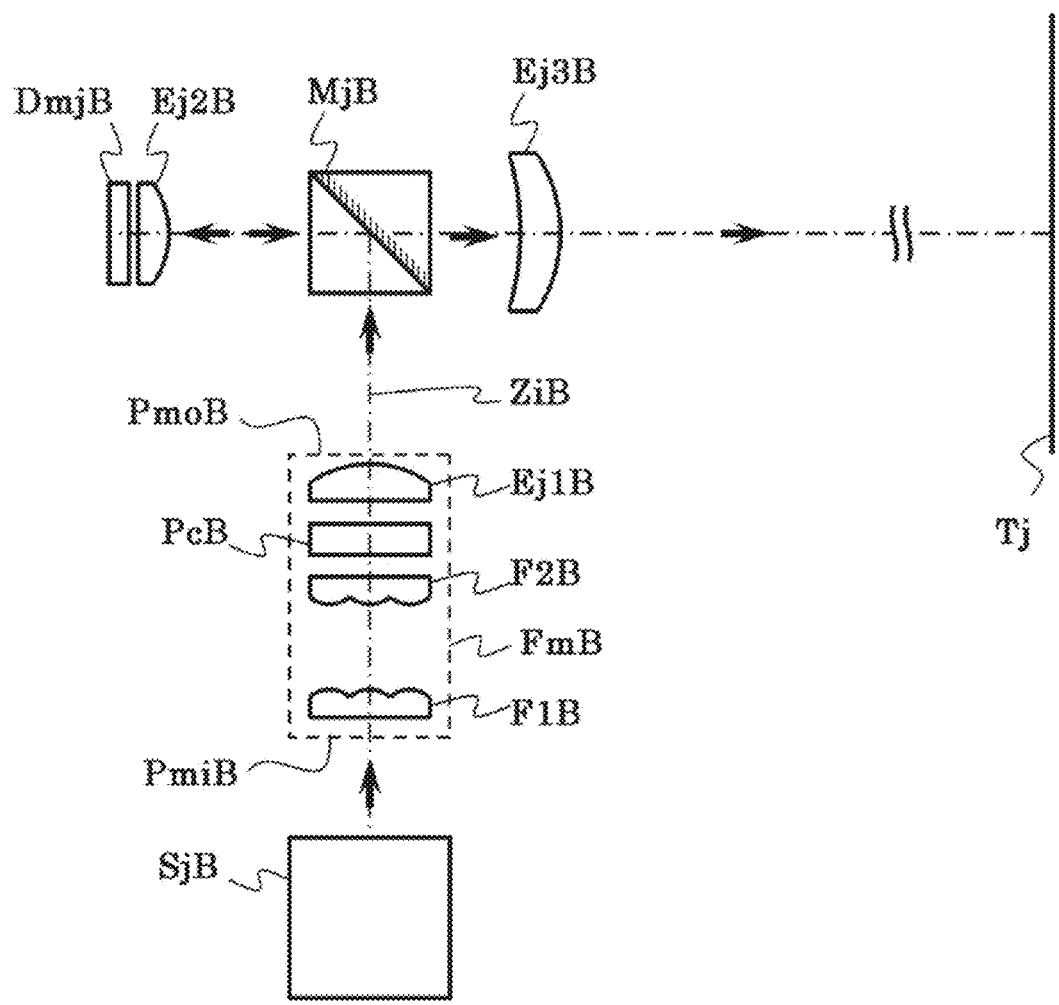
FIG. 8 is a diagram for explaining a part of one kind of existing projectors.

The output luminous flux (Fo) enters a focusing lens (Eu), and the focused output luminous flux then enters an incident end (Pmi) of a homogenizing means (Fm) that is configured of a rod integrator, through a diffusion element (Edm) for removing speckles. The optical system subsequent to an exit end (Pmo) of the homogenizing means (Fm) is similar to that described with reference to FIG. 7 described above. The light source unit according to the embodiment of the invention may be used in a projector that uses a homogenizing means configured of a fly eye integrator, described with reference to FIG. 8 described above.

The dichroic mirror (HuB) is so fabricated as to allow light of colors R and G to pass therethrough as much as possible and as to reflect light of B-color as much as possible. However, reflected light of colors R and G and transmitted light of B-color exist to no small extent, and such light is normally discarded as stray light. In the light source unit in FIG. 6, however, such light is effectively used to acquire the measurement-use output luminous flux (Fo'). The measurement-use output luminous flux (Fo') enters an imaging optical system (Ea) that is configured of a lens, and an actual image that is conjugate with the R exit ends (EoR1, EoR2, . . . ), the G exit ends (EoG1, EoG2, . . . ), and the B exit ends (EoB1, EoB2, . . . ) of the fiber bundles is formed on an imaging surface of an image pickup element for color picture (C).

A picture signal (Sg) of the image picked up by the image pickup element for color picture (C) is transmitted to a light intensity measurement circuit (H) in order to generate the first light intensity measurement data (Sh1R, Sh1G, Sh1B) and the second light intensity measurement data (Sh2R, Sh2G, Sh2B). Similarly to that described in FIG. 5, the filter frame (Kt) attached with the light characteristic filters (Et1, Et2) is disposed in front of or behind the imaging optical system (Ea), and the light characteristic filters (Et1, Et2) are switchable by a moving mechanism (Km) such as a solenoid.

The control circuit (Mc) operates the moving mechanism (Km) to select one of the light characteristic filters (Et1, Et2), allows the image pickup element for color picture (C) to alternately function as the light intensity measurement means (A1R, A1G, A1B) and the second light intensity measurement means (A2R, A2G, A2B), and accordingly acquires the first light intensity measurement data (Sh1R, Sh1G, Sh1B) and the second light intensity measurement data (Sh2R, Sh2G, Sh2B). In addition, the control circuit (Mc) separately measures the light intensity of each of the R exit ends (EoR1, EoR2, . . . ), the G exit ends (EoG1, EoG2, . . . ), and the B-color exit ends (EoB1, EoB2, . . . ), and monitors whether abnormality of light intensity reduction occurs in any of the exit ends.

In the above description, the case where the color band light characteristic measurement means of all of the wavelength bands R, G, and B is configured of the first light intensity measurement means (A1R, A1G, A1B) that have the first spectral sensitivity characteristics for the respective wavelength bands and the second light intensity measurement means (A2R, A2G, A2B) that have the second spectral sensitivity characteristics for the respective wavelength bands has been exemplified. Further, the measurement of the light emitting intensity indicating values Sr, Sg, and Sb and the deviation from normal wavelength $\Delta\lambda r$, $\Delta\lambda g$, and $\Delta\lambda b$ as the wavelength deviation indicating values with use of the expressions 8, 9, and 10 has been described. In the light source unit according to the embodiment of the invention, alternate color band light characteristic measurement means having a configuration different from that described above may be used for any of the wavelength bands.

For example, in the case of a complicated configuration, measurement means in which the measurement-use output luminous flux (Fo') is dispersed by a wavelength dispersive optical element such as a diffraction grating, and for example, an image pickup element such as a one-dimensional image sensor receives the dispersed light to perform spectrophotometric measurement to acquire the light emitting intensity indicating values correlated with the light intensity and the wavelength deviation indicating values correlated with the deviation from normal wavelength, may be used as the alternate color band light characteristic measurement means. Alternatively, for example, in the case of a simple configuration, measurement means in which correlation between a temperature of the light emitting element and variation of the emission wavelength is measured in advance, a temperature sensor to measure the temperature of the light emitting element is provided, the wavelength deviation indicating values correlated with the deviation from normal wavelength are acquired based on the measured temperature, an optical sensor that has sensitivity in the wavelength band and is insensitive to the wavelength variation is provided, and the light emitting intensity indicating values correlated with the light intensity are acquired by measuring the light intensity of the measurement-use output luminous flux (Fo'), may be used as the alternate color band light characteristic measurement means.

Regarding the wavelength band using such alternate color band light characteristic measurement means, for example, in the case of the wavelength band of B-color, the light emitting intensity indicating value Sb and the wavelength deviation indicating value $\Delta\lambda b$ are obtained not from the expression 10 but through calculation corresponding to the band color light characteristic measurement means.

Further, in the embodiment of the invention, in the case where the light emitting element in which the wavelength variation do not occurs or is ignorable in any of the wavelength bands is included, only the light emitting intensity indicating values correlated with the light intensity are acquired for the wavelength band, and the calculation of the expressions 15 to 20 may be performed while the value corresponding to the wavelength band out of the wavelength deviation indicating values $\Delta\lambda r$, $\Delta\lambda g$, and $\Delta\lambda b$ in the expressions 15 to 20 is assumed to be 0. Actually, in a semiconductor laser whose oscillation wavelength is stabilized, a semiconductor laser having a resonance reflector that is configured of a volume Bragg diffraction grating, a non-linear optical harmonic oscillator, and the like, a light emitting element capable of being handled in such a way exits. For example, in the case where the wavelength band is G-color, an optical sensor having sensitivity for the G wavelength band may be provided to measure the light intensity of the measurement-use output luminous flux (Fo'), and the obtained light emitting intensity indicating value Sg and the wavelength deviation indicating value $\Delta\lambda g=0$ may be applied to the expressions 15 to 20.

Note that the technology may be configured as follows.

(1) A light source unit including:

a plurality of elemental light sources each including one or more light emitting elements and one or more drive circuits, and each configured to emit output luminous flux to outside, the one or more drive circuits being provided corresponding to the respective light emitting elements and each being configured to drive corresponding light emitting element, the output luminous flux being configured of radiated light from the one or more light emitting elements;

a control circuit configured to control the drive circuits; and a plurality of color band light characteristic measurement sections each configured to receive light of a quantity correlated with light intensity of the output luminous flux to generate color band light characteristic measurement data, wherein a plurality of the light emitting elements in the plurality of elemental light sources include a plurality of light emitting elements different in wavelength band of emission wavelength from one another, the plurality of color band light characteristic measurement sections are provided corresponding to a plurality of the wavelength bands, one or more of the plurality of color band light characteristic measurement sections include a first light intensity measurement section and a second light intensity measurement section, the first light intensity measurement section having first spectral sensitivity characteristics in a corresponding wavelength band and generating first light intensity measurement data as the color band light characteristic measurement data, and the second light intensity measurement section having second spectral sensitivity characteristics different in rate of sensitivity varying against wavelength varying from the first spectral sensitivity characteristics and generating second light intensity measurement data as the color band light characteristic measurement data, the control circuit generates light intensity indicating values correlated with light intensity and wavelength deviation indicating values correlated with deviation from normal wavelength, with use of local color band spectral sensitivity information, based on the first light intensity measurement data and the second light intensity measurement data, the local color band spectral sensitivity information including sensitivity value at the normal wavelength and the rate of sensitivity varying against wavelength varying for each of the first and second spectral sensitivity characteristics, and the control circuit generates color phase indicating values correlated with color of integrated light of the output luminous flux and performs first feedback control on the drive circuits to allow a difference between the color phase indicating values and target values to be small, with use of the wavelength deviation indicating values and local color band color matching function information, the local color band color matching function information including function values of a color matching function at the normal wavelength and rate of the color matching function output varying against wavelength varying.

(2) The light source unit according to (1), wherein the control circuit may generate a brightness indicating value that is correlated with brightness of integral light of the output luminous flux, and may perform second feedback control on the drive circuits to allow a difference between the brightness indicating value and a target value.

(3) The light source unit according to (1) or (2), wherein the control circuit may determine coefficients of linear operation, the linear operation representing variation of the color phase indicating values when the light emitting intensity indicating values for the respective wavelength bands are slightly varied, with use of variation of the light emitting intensity indicating values, and may determine the variation of the light emitting intensity indicating values for the respective wavelength bands through the coefficients to perform the first feedback control (4) The light source unit according to any one of (1) to (3), wherein the first light intensity measurement section may include a first optical sensor, the second light intensity measurement section may include a second optical sensor, and a light characteristic filter may be provided on a front surface of one or both of the first optical sensor and the second optical sensor.

(5) The light source unit according to any one of (1) to (3), wherein the first light intensity measurement section is realized by a light intensity measurement section provided with time-divisional characteristic variation, the second light intensity measurement section may be realized by the light intensity measurement section provided with time-divisional characteristic variation that may be different from the time-divisional characteristic variation provided for the first light intensity measurement section, the light intensity measurement section may include an optical sensor, and when the light intensity measurement section functions as the second light intensity measurement section, a light characteristic filter different from a light characteristic filter when the light intensity measurement section functions as the first light intensity measurement section, may be provided.

(6) The light source unit according to any one of (1) to (5), wherein one or both of an optical sensor included in the first light intensity measurement section and an optical sensor included in the second light intensity measurement section may be image pickup elements.

(7) A projector may include:
the light source unit according to any one of (1) to (6); and
an optical system configured to use the output luminous flux emitted from the light source unit, to project and display an image.

It should be understood by those skilled in the art that various modifications, combinations, sub-combinations, and alterations may occur depending on design requirements and other factors insofar as they are within the scope of the appended claims or the equivalents thereof.

What is claimed is:

1. A light source unit comprising:
   a plurality of elemental light sources each including one or more light emitting elements and one or more drive circuits, and each configured to emit output luminous flux to outside, the one or more drive circuits being provided corresponding to the respective light emitting elements and each being configured to drive corresponding light emitting element, the output luminous flux being configured of radiated light from the one or more light emitting elements;
   a control circuit configured to control the drive circuits; and
   a plurality of color band light characteristic measurement sections each configured to receive light of a quantity correlated with light intensity of the output luminous flux to generate color band light characteristic measurement data, wherein
   a plurality of the light emitting elements in the plurality of elemental light sources include a plurality of light emitting elements different in wavelength band of emission wavelength from one another,
   the plurality of color band light characteristic measurement sections are provided corresponding to a plurality of the wavelength bands,
   one or more of the plurality of color band light characteristic measurement sections include a first light intensity measurement section and a second light intensity measurement section, the first light intensity measurement section having first spectral sensitivity characteristics in a corresponding wavelength band and generating first light intensity measurement data as the color band light characteristic measurement data, and the second light intensity measurement section having second spectral sensitivity characteristics different in rate of sensitivity varying against wavelength varying from the first spectral sensitivity characteristics and generating second light intensity measurement data as the color band light characteristic measurement data,
   the control circuit generates light intensity indicating values correlated with light intensity and wavelength deviation indicating values correlated with deviation from normal wavelength, with use of local color band spectral sensitivity information, based on the first light intensity measurement data and the second light intensity measurement data, the local color band spectral sensitivity information including sensitivity value at the normal wavelength and the rate of sensitivity varying against wavelength varying for each of the first and second spectral sensitivity characteristics, and
   the control circuit generates color phase indicating values correlated with color of integrated light of the output luminous flux and performs first feedback control on the drive circuits to allow a difference between the color phase indicating values and target values to be small, with use of the wavelength deviation indicating values and local color band color matching function information, the local color band color matching function information including function values of a color matching function at the normal wavelength and rate of the color matching function output varying against wavelength varying.

2. The light source unit according to claim 1, wherein the control circuit generates a brightness indicating value that is correlated with brightness of integral light of the output luminous flux, and performs second feedback control on the drive circuits to allow a difference between the brightness indicating value and a target value.

3. The light source unit according to claim 1, wherein the control circuit determines coefficients of linear operation, the linear operation representing variation of the color phase indicating values when the light emitting intensity indicating values for the respective wavelength bands are slightly varied, with use of variation of the light emitting intensity indicating values, and determines the variation of the light emitting intensity indicating values for the respective wavelength bands through the coefficients to perform the first feedback control.

4. The light source unit according to claim 1, wherein
   the first light intensity measurement section includes a first optical sensor,
   the second light intensity measurement section includes a second optical sensor, and
   a light characteristic filter is provided on a front surface of one or both of the first optical sensor and the second optical sensor.

5. The light source unit according to claim 1, wherein
   the first light intensity measurement section is realized by a light intensity measurement section provided with time-divisional characteristic variation,
   the second light intensity measurement section is realized by the light intensity measurement section provided with time-divisional characteristic variation that is different from the time-divisional characteristic variation provided for the first light intensity measurement section,
   the light intensity measurement section includes an optical sensor, and
   when the light intensity measurement section functions as the second light intensity measurement section, a light characteristic filter different from a light characteristic filter when the light intensity measurement section functions as the first light intensity measurement section, is provided.

6. The light source unit according to claim 1, wherein one or both of an optical sensor included in the first light intensity measurement section and an optical sensor included in the second light intensity measurement section are image pickup elements.

7. A projector comprising:
   the light source unit according to claim 1; and
   an optical system configured to use the output luminous flux emitted from the light source unit, to project and display an image.

* * * * *